United States Patent
Takahashi et al.

(10) Patent No.: US 10,606,173 B2
(45) Date of Patent: Mar. 31, 2020

(54) PHOTOSENSITIVE SILOXANE COMPOSITION

(71) Applicant: AZ Electronic Materials (Luxembourg) S.a.r.l., Luxembourg (LU)

(72) Inventors: Megumi Takahashi, Kakegawa (JP); Daishi Yokoyama, Kakegawa (JP); Naofumi Yoshida, Kakegawa (JP); Katsuto Taniguchi, Kakegawa (JP); Masahiro Kuzawa, Nagoya (JP)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 0 days.

(21) Appl. No.: 16/087,713

(22) PCT Filed: Mar. 23, 2017

(86) PCT No.: PCT/EP2017/057005
§ 371 (c)(1),
(2) Date: Sep. 24, 2018

(87) PCT Pub. No.: WO2017/162831
PCT Pub. Date: Sep. 28, 2017

(65) Prior Publication Data
US 2019/0077961 A1 Mar. 14, 2019

(30) Foreign Application Priority Data

Mar. 25, 2016 (JP) .................................. 2016-062385

(51) Int. Cl.
| | |
|---|---|
| *G03F 7/023* | (2006.01) |
| *G03F 7/40* | (2006.01) |
| *G03F 7/075* | (2006.01) |
| *G03F 7/022* | (2006.01) |
| *C09D 183/04* | (2006.01) |
| *C08L 83/04* | (2006.01) |
| *C08L 101/08* | (2006.01) |
| *C08L 101/12* | (2006.01) |
| *G03F 7/20* | (2006.01) |

(52) U.S. Cl.
CPC ............ *G03F 7/0226* (2013.01); *C08L 83/04* (2013.01); *C08L 101/08* (2013.01); *C08L 101/12* (2013.01); *C09D 183/04* (2013.01); *G03F 7/022* (2013.01); *G03F 7/0233* (2013.01); *G03F 7/0757* (2013.01); *G03F 7/0758* (2013.01); *G03F 7/20* (2013.01); *G03F 7/40* (2013.01)

(58) Field of Classification Search
CPC ........ G03F 7/0226; G03F 7/40; G03F 7/0757; G03F 7/0758; G03F 7/0233
USPC .................. 430/191, 192, 193, 330
See application file for complete search history.

(56) References Cited

U.S. PATENT DOCUMENTS

| | | | |
|---|---|---|---|
| 8,709,552 B2* | 4/2014 | Miyoshi ................. | C08G 73/10 428/1.1 |
| 8,883,397 B2 | 11/2014 | Yokoyama et al. | |
| 9,395,627 B2* | 7/2016 | Liu ....................... | G03F 7/0757 |
| 9,541,832 B2* | 1/2017 | Wu ........................ | G03F 7/038 |
| 2006/0192481 A1 | 8/2006 | Nagayama et al. | |
| 2012/0070781 A1* | 3/2012 | Katayama ............ | C07D 295/18 430/281.1 |
| 2012/0183751 A1* | 7/2012 | Katayama ............ | C07D 295/18 428/195.1 |
| 2015/0031808 A1* | 1/2015 | Huang .................. | G03F 7/0757 524/159 |
| 2015/0293449 A1* | 10/2015 | Wu ....................... | G03F 7/0233 430/281.1 |

FOREIGN PATENT DOCUMENTS

| | | |
|---|---|---|
| JP | H05165214 A | 7/1993 |
| JP | 2933879 B2 | 6/1997 |
| JP | 2001240757 A | 9/2001 |
| JP | 2006178436 A | 7/2006 |
| JP | 2006236839 A | 9/2006 |
| JP | 2008170937 A | 7/2008 |
| JP | 2011227159 A | 11/2011 |
| KR | 20120056773 A | 6/2012 |
| KR | 20140000211 A | 1/2014 |
| WO | WO-2009028360 A1 | 3/2009 |

OTHER PUBLICATIONS

International Search Report for PCT/EP2017/057005 dated Jun. 7, 2017.
Song, J.-H., et al., "Views on the low-resistant bus materials and thelr process architecture for the large-sized & post-ultra definition TFT-LCD", IMID/IDMC/Asia Display Digest, (2008), pp. 9-12.
Written Opinion of the International Searching Authority for PCT/EP2017/057005 dated Jun. 7, 2017.
Office Action for corresponding Japanese application No. 2018-533762 dated Feb. 1, 2019 (English translation).

(Continued)

*Primary Examiner* — John S Chu
(74) *Attorney, Agent, or Firm* — Faegre Drinker Biddle & Reath LLP

(57) ABSTRACT

[Object] To provide a composition capable of forming a cured film having low permittivity and excellence in chemical resistance, in heat resistance and in resolution; and further to provide a production process employing the composition. [Means] The present invention provides a composition comprising: an alkali-soluble resin, namely, a polymer comprising a carboxyl-containing polymerization unit and an alkoxysilyl-containing polymerization unit; a polysiloxane; a diazonaphthoquinone derivative; a compound generating acid or base when exposed to heat or light; and a solvent.

20 Claims, No Drawings

(56) References Cited

OTHER PUBLICATIONS

Office Action for corresponding Republic of Korea application No. 10-2018-7031003 dated Feb. 7, 2019 (English translation).

\* cited by examiner

PHOTOSENSITIVE SILOXANE COMPOSITION

CROSS-REFERENCE TO RELATED APPLICATIONS

This application is a national stage application (under 35 U.S.C. § 371) of PCT/EP2017/057005, filed Mar. 23, 2017, which claims benefit of Japanese Application No. 2016-062385, filed Mar. 25, 2016, both of which are incorporated herein by reference in their entirety.

TECHNICAL FIELD

The present invention relates to a photosensitive siloxane composition. Further, this invention also relates to a process for forming a cured film from the composition, a cured film formed thereby, and a device comprising the cured film.

BACKGROUND ART

In the field of optical devices, such as, displays, light emitting diodes and solar cells, various proposals have been recently made for the purposes of energy conservation and of improvement in light utilization efficiency. For example, there is a known method for increasing the aperture ratio of a liquid crystal display. In that method, a transparent planarization film is formed to cover a TFT element and then pixel electrodes are formed on the planarization film (see, Patent document 1). Also, in order that the aperture ratio of an organic EL device may be increased like that of a liquid crystal display, it is proposed to change the light extraction method from "bottom emission type" into "top emission type" (see, Patent document 2). Specifically, a bottom emission type of organic EL device comprises a substrate, a transparent pixel electrode provided thereon and a luminescent layer formed on the electrode by vapor deposition, and the emitted light is extracted from the substrate side. In contrast, a top emission type of organic EL device comprises a TFT element, a planarization film provided thereon for covering the element, a transparent pixel electrode formed thereon and a luminescent layer placed thereon, and the light emitted from the luminescent layer is extracted from the side opposite to the TFT element.

According as display devices have been getting enlarged, improved in resolution and in image quality and developed in 3D imaging, signal delay in wiring has been becoming a serious problem. When rewriting speed (flame frequency) of image information is accelerated, signals inputted to the TFT element are shortened. However, since images are required to be displayed in high resolution, there is a limitation on such enlargement of the wiring width as is intended to reduce the wiring resistance. In view of that, it is proposed to increase the wiring thickness enough to solve the problem of signal delay (see, Non-patent document 1).

As materials for the planarization film formed on the TFT substrate in the above proposal, it is known to adopt an acrylic resin and a quinone diazide compound in combination (see, Patent documents 3 and 4). Those materials are not drastically impaired in their properties at as high a temperature as 200° C. or above, but they gradually come to decompose at 230° C. or above and consequently the film thickness may be decreased. Further, when the substrate is treated at a high temperature, the film tends to be colored to reduce the transparency thereof. Because of that, the above materials cannot be adopted to form a transparent film employed in a process for providing a coating layer thereon at a high temperature by means of an apparatus such as PE-CVD. Also for producing an organic EL device, they cannot be said to be optimal materials because decomposed products thereof have negative influences on the luminance efficiency and lifetime of the organic EL device. In addition, acrylic resins modified to be heat-resistant generally have high permittivity, and hence an insulating film thereof has such a large parasitic capacitance as to increase the power consumption, to cause delay of liquid crystal driving signals and, as a result, to lower the quality of displayed images. Even if the insulating film is made of materials having high permittivity, the capacitance can be reduced by, for example, thickening the film. However, that coping method is not preferred because it is generally difficult to form a thick and uniform film and further because it is necessary to use a large amount of the materials.

Meanwhile, polysiloxanes, particularly, silsesquioxanes are known as materials of high heat resistance and of high transparency. A silsesquioxane is a polymer comprising a trifunctional siloxane structural unit $RSi(O_{1.5})$, which can be considered to have an intermediate chemical structure between an inorganic silica structure $(SiO_2)$ and an organic silicone $(R_2SiO)$. This polymer is such a specific compound as is soluble in an organic solvent but forms a cured product characteristically having high heat resistance almost comparable to that of inorganic silica. Further, there is also a known material comprising a polysiloxane and a quinone diazide compound in combination (see, Patent document 5). According to the document, this material has high transparency and can form a highly transparent cured film on a substrate. The transparency of the cured film is reported not to lower even if the substrate is treated at a high temperature. Patent document 6 discloses another material comprising a siloxane polymer and an acrylic resin.

PRIOR ART DOCUMENTS

Patent Documents

[Patent document 1] Japanese Patent No. 2933879
[Patent document 2] Japanese Patent Laid-Open No. 2006-236839
[Patent document 3] Japanese Patent Laid-Open No. H5(1993)-165214
[Patent document 4] Japanese Patent Laid-Open No. 2001-240757
[Patent document 5] Japanese Patent Laid-Open No. 2006-178436
[Patent document 6] Japanese Patent Laid-Open No. 2008-170937

Non-Patent Documents

[Non-patent document 1] IMID/IDMC/ASIA DISPLAY 2008 Digest (pp. 9 to 12)

DISCLOSURE OF INVENTION

Problem to be Solved by the Invention

The present invention is achieved in consideration of the above background, and aims to provide a composition capable of forming a cured film having low permittivity and excellence in chemical resistance, in heat resistance and in resolution. Further, the present invention also aims to provide a production method employing the composition.

Means for Solving Problem

The composition according to the present invention comprises:
an alkali-soluble resin which is a polymer comprising a carboxyl-containing polymerization unit and an alkoxysilyl-containing polymerization unit,
a polysiloxane,
a diazonaphthoquinone derivative,
a compound generating acid or base when exposed to heat or light, and
a solvent.

The method for forming a cured film according to the present invention, comprises:
coating a substrate with the above composition, to form a coating film;
exposing the coating film to light;
developing the exposed film with an alkali developer, to form a pattern; and
heating the obtained pattern.

The cured film according to the present invention is produced by a method comprising:
coating a substrate with the above composition, to form a coating film;
exposing the coating film to light;
developing the exposed film with an alkali developer, to form a pattern; and
heating the obtained pattern.

Effect of the Invention

The composition according to the present invention can form a cured film having low permittivity and excellence in chemical resistance, in heat resistance and in resolution. The thus obtained cured film is also excellent in planarization and in electrical insulating properties, and hence can be favorably employed as a material for optical elements, such as, optical waveguides, as well as, as a material for various films, such as, planarization films on thin-film transistor (TFT) substrates, which are used as backplanes of displays such as LCD devices or organic EL devices; interlayer insulating films in semiconductor devices; and other insulating films or transparent protective films of solid state image sensors, of antireflection panels or films, of optical filters, of high brightness LCD devices, of touch panels, and of solar cells.

BEST MODE FOR CARRYING OUT THE INVENTION

Composition

The composition according to the present invention is characterized by comprising: an alkali-soluble resin which is a polymer comprising a carboxyl-containing polymerization unit and an alkoxysilyl-containing polymerization unit, a polysiloxane, a diazonaphthoquinone derivative, a compound generating acid or base when exposed to heat or light, and a solvent. Those ingredients contained in the composition of the present invention will be individually explained below in detail.

(I) Alkali-Soluble Resin

The composition according to the present invention contains an alkali-soluble resin which is a polymer comprising a carboxyl-containing polymerization unit and an alkoxysilyl-containing polymerization unit. The polymer is preferably a copolymer obtained by polymerization of different monomers.

The carboxyl-containing polymerization unit necessarily has a carboxyl group in the side chain, and is preferably derived from an unsaturated carboxylic acid, an unsaturated carboxylic anhydride, or a mixture thereof.

The alkoxysilyl-containing polymerization unit necessarily has an alkoxysilyl group in the side chain, and is preferably derived from a monomer represented by the following formula (I):

$$X\text{—}(CH_2)_a\text{—}Si(OR)_b(CH_3)_{3-b} \qquad (I).$$

In the formula, X is vinyl, styryl, or (meth)acryloyloxy group; R is methyl or ethyl group; a is an integer of 0 to 3; and b is an integer of 1 to 3.

The above polymer preferably further comprises a hydroxyl-containing polymerization unit derived from a hydroxyl-containing unsaturated monomer.

There are no particular restrictions on the weight average molecular weight of the alkali-soluble resin according to the present invention, but it is preferably 3000 to 50000, more preferably 4000 to 30000. Here, the "weight average molecular weight" means a polystyrene-reduced weight average molecular weight determined by gel permission chromatography. The number of acid groups is also not restricted, but the solid content acid value is preferably 10 to 200 mg KOH/g, more preferably 15 to 150 mg KOH/g in view of both reactivity and storage stability.

In the following description, the constituting units of the alkali-soluble resin will be individually explained.

(Carboxyl-Containing Polymerization Unit)

The carboxyl-containing polymerization unit fills the role of dissolving the polymer in an alkali developer. Examples of the unsaturated carboxylic acid for forming the carboxyl-containing polymerization unit include: (meth)acrylic acid, maleic acid, fumaric acid, crotonic acid, itaconic acid, citraconic acid, mesaconic acid, and cinnamic acid. Examples of the unsaturated carboxylic anhydride include: maleic acid anhydride, itaconic acid anhydride, citraconic acid anhydride, phthalic acid anhydride, tetrahydrophthalic acid anhydride, trimellic acid anhydride, and pyromellitic acid anhydride. It is also possible to use mixtures of those unsaturated carboxylic acids and unsaturated carboxylic anhydrides.

Among the above, (meth)acrylic acid is preferred. That is because (meth)acrylic acid enhances the solubility in the developer and consequently provides a pattern of good perpendicularity and high contrast. The content of the carboxyl-containing polymerization unit in the polymer is preferably 3 wt % or more so as to increase the solubility in the area where the alkali-soluble resin is intended to dissolve in the alkali developer, but preferably 50 wt % or less so as to surely keep the resin remaining in the area where the resin is intended not to dissolve. The carboxyl-containing polymerization unit is preferably contained in an amount of 5 to 30 wt %.

(Alkoxysilyl-Containing Polymerization Unit)

The alkoxysilyl-containing polymerization unit fills the role of forming a crosslinking structure in the polymer and enabling the cured film to have properties such as resistance against heat and chemicals. The monomer represented by the above formula (I), from which the alkoxysilyl-containing polymerization unit can be derived, is not particularly restricted as long as it has the structure of the formula (I). However, the integer b is preferably 2 or 3 because, if b is 1, the cured film tends to have too low crosslinking density to be sufficiently resistant to heat and chemicals.

Examples of the monomer include: 3-(meth)acryloyloxy-propylmethyldimethoxysilane, 3-(meth)acryloyloxypropyltrimethoxysilane, 3-(meth)acryloyloxypropylmethyldiethoxysilane, 3-(meth)acryloyloxypropyltriethoxysilane, p-styryltrimethoxysilane, vinyltrimethoxysilane, vinyltriethoxysilane, vinyltriacetoxysilane, acrylic trimethoxysilane, and oligomerized or polymerized compounds thereof.

The content of the alkoxysilyl-containing polymerization unit in the polymer is preferably 1 wt % or more so that the cured film can have resistance to heat and chemicals, but preferably 50 wt % or less so as not to impair the storage stability. The alkoxysilyl-containing polymerization unit is particularly preferably contained in an amount of 5 to 40 wt %.

(Hydroxyl-Containing Polymerization Unit)

The hydroxyl-containing polymerization unit can be incorporated so as to form a crosslinking structure in the polymer and thereby to give properties of mechanical strength and the like to the cured film. This polymerization unit can be derived from a hydroxyl-containing unsaturated monomer, which is not particularly restricted as long as it contains a hydroxyl group. Examples of the hydroxyl-containing unsaturated monomer include: a hydroxyalkyl (meth)acrylate ester having an alkyl group of 1 to 16 carbon atoms, such as, 2-hydroxyethyl (meth)acrylate, 4-hydroxybutyl (meth)acrylate, 5-hydroxypentyl (meth)acrylate, 6-hydroxyhexyl (meth)acrylate, or 8-hydroxyoctyl (meth)acrylate; a caprolactone-modified monomer, such as, caprolactone-modified 2-hydroxyethyl (meth)acrylate; an oxyalkylene-modified monomer, such as, diethylene glycol (meth)acrylate, or polyethylene glycol (meth)acrylate; a primary hydroxyl-containing monomer, such as, 2-acryloyloxyethyl-2-hydroxyethylphthalic acid, N-methylol(meth)acrylamide, N-hydroxyethyl(meth)acrylamide, or 1,4-cyclohexanedimethanol monoacrylate; a secondary hydroxyl-containing monomer, such as, 2-hydroxypropyl (meth)acrylate, 2-hydroxybutyl (meth)acrylate, 2-hydroxypropyl-3-phenoxypropyl (meth)acrylate, or 3-chloro-2-hydroxypropyl (meth)acrylate; and a tertiary hydroxyl-containing monomer, such as, 2,2-dimethyl-2-hydroxyethyl (meth)acrylate.

Further, examples of compounds employable as the hydroxyl-containing unsaturated monomer include: a polyethylene glycol derivative, such as, diethylene glycol (meth)acrylate, or polyethylene glycol mono(meth)acrylate; a polypropylene glycol derivative, such as, polypropylene glycol mono(meth)acrylate; an oxyalkylene-modified monomer, such as, poly(ethylene glycol-polypropylene glycol) mono(meth)acrylate, poly(ethylene glycol-tetramethylene glycol) mono(meth)acrylate, or poly(polypropylene glycol-tetramethylene glycol) mono(meth)acrylate; and glycerol (meth)acrylate.

The content of the hydroxyl-containing polymerization unit in the polymer is preferably 3 wt % or more so that the cured film can have the properties of mechanical strength and the like, but preferably 40 wt % or less so as not to impair the storage stability. The alkoxysilyl-containing polymerization unit is particularly preferably contained in an amount of 5 to 35 wt %.

(Other Polymerization Units)

Other polymerization units can be also included so as to form the main skeleton of the polymer and to give properties of mechanical strength and the like to the cured film. Those polymerization units are derived from copolymerizable monomers, which are not particularly limited. Examples of the copolymerizable monomers include: aromatic vinyl compounds, such as, styrene, α-methylstyrene, tert-butylstyrene, o-vinyltoluene, m-vinyltoluene, p-vinyltoluene, p-chlorotoluene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl glycidyl ether, m-vinylbenzyl glycidyl ether, and p-vinylbenzyl glycidyl ether; and unsaturated carboxylic acid esters, such as, methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, 2-ethylhexyl (meth)acrylate, octyl (meth)acrylate, n-nonyl (meth)acrylate, i-nonyl (meth)acrylate, n-decyl (meth)acrylate, i-decyl (meth)acrylate, lauryl (meth)acrylate, tridecyl (meth)acrylate, cetyl (meth)acrylate, n-stearyl (meth)acrylate, i-stearyl (meth)acrylate, behenyl (meth)acrylate, cyclohexyl (meth)acrylate, phenyl (meth)acrylate, tetrahydrofurfuryl (meth)acrylate, isobornyl (meth)acrylate, 2-methyl-2-adamantyl (meth)acrylate, 2-ethyl-2-adamantyl (meth)acrylate, 2-isopropyl-2-adamantyl (meth)acrylate, 2-methoxyethyl (meth)acrylate, 2-phenoxyethyl (meth)acrylate, diethylene glycol monomethyl ether (meth)acrylate, triethylene glycol monomethyl ether (meth)acrylate, propylene glycol monomethyl ether (meth)acrylate, dipropylene glycol monomethyl ether (meth)acrylate, isobornyl (meth)acrylate, 2-hydroxy-3-phenoxypropyl (meth)acrylate, 2-aminoethyl (meth)acrylate, 2-dimethylaminoethyl (meth)acrylate, 2-aminopropyl (meth)acrylate, 2-dimethylaminopropyl (meth)acrylate, 3-aminoethyl (meth)acrylate, 3-dimethylaminoethyl (meth)acrylate, glycidyl (meth)acrylate, 2,2,2-trifluoroethyl (meth)acrylate, 2,2,3,3-tetrafluoropropyl (meth)acrylate, 2,2,3,3,3-pentafluoropropyl (meth)acrylate, 2,2,3,4,4,4-hexafluorobutyl (meth)acrylate, 2-(perfluorobutyl)ethyl (meth)acrylate, 3-perfluorobutyl-2-hydroxypropyl (meth)acrylate, 2-(perfluorohexyl)ethyl (meth)acrylate, 3-perfluorohexyl-2-hydroxyl-propyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, and perfluorooctylethyl (meth)acrylate.

The content of other polymerization units in the polymer is preferably 10 wt % or more so that the cured film can have the properties of mechanical strength and the like, but preferably 80 wt % or less so that the polymer can surely contain the indispensable constituents.

There are no particular restrictions on the blend ratio between the polysiloxane and the alkali-soluble resin. However, the alkali-soluble resin is preferably blended in a relatively large amount if the coating film is intended to be formed thick, but on the other hand the polysiloxane is preferably blended in a relatively large amount in view of the transparency and the chemical resistance, particularly, when the composition is intended to be used in a process at a high temperature. Accordingly, the blend ratio between the alkali-soluble resin and the polysiloxane is preferably 5:95 to 95:5, more preferably 10:90 to 80:20.

(II) Polysiloxane

The composition according to the present invention contains a polysiloxane as a main ingredient. The term "polysiloxane" means a polymer having Si—O—Si bonds, and it means not only an unsubstituted inorganic polysiloxane but also an organic group-substituted organic polysiloxane in the present invention. The polysiloxane compound generally has silanol groups or alkoxysilyl groups. The terms "silanol groups" and "alkoxysilyl groups" mean hydroxyl groups and alkoxy groups, respectively, which directly connect to silicon atoms constituting the siloxane skeleton. Those groups have a function of promoting a curing reaction when a cured film is formed from the composition, and they are also thought to contribute to the reaction with the later-described silane coupling agent. Accordingly, the polysiloxane preferably has those groups.

The polysiloxane used in the present invention is not particularly restricted on its structure, and can be freely selected in accordance with the aimed applications. According to the number of oxygen atoms connecting to a silicon atom, the structure of polysiloxane can be generally categorized into the following three skeletons, that is: silicone skeleton (in which two oxygen atoms connect to a silicon atom), silsesquioxane skeleton (in which three oxygen atoms connect to a silicon atom), and silica skeleton (in which four oxygen atoms connect to a silicon atom). In the present invention, the polysiloxane may have any of those skeletons. Further, the polysiloxane molecule may contain two or more of them in combination.

In the case where an organic polysiloxane is adopted, substituent groups contained therein can be freely selected unless they impair the effect of the present invention. The substituent groups are, for example, groups having no Si—O bonds, which constitute the siloxane structure. Examples thereof include alkyl groups, hydroxyalkyl groups, aryl groups, and groups in which hydrogen atoms in those groups are substituted with unsaturated hydrocarbon groups.

The siloxane resin may have reactive groups other than the silanol or alkoxysilyl groups, such as, carboxyl groups, sulfonyl groups, and amino groups, unless they impair the effect of the present invention. However, those reactive groups generally tend to lower the storage stability of the composition, and hence they are preferably contained in a small amount. Specifically, the amount thereof is preferably 10 mol % or less based on the total number of hydrogen atoms or substituent groups connecting to silicon atoms. Further, those reactive groups are particularly preferably not contained at all.

It is for the purpose of forming a cured film that the composition of the present invention is coated on a substrate, imagewise exposed to light, developed and then heated. This means that there must be a difference in solubility between the exposed area and the unexposed area. For example, when the photosensitive siloxane composition containing a diazonaphthoquinone derivative as a dissolution inhibitor is developed with a 2.38 wt % aqueous solution of tetramethylammonium hydroxide (hereinafter often referred to as "TMAH") as a developer, it is practically possible to produce a positive type pattern by exposure-development procedures if a 1000 Å or more-thick film of the composition has a dissolution rate of 10 Å/second or more in the 2.38 wt % TMAH aqueous solution. Here, "practically possible" means that the developing time is within several minutes. However, the required solubility depends on the thickness of the formed film and on the development conditions, and hence the polysiloxane and the alkali-soluble resin must be properly selected according to the development conditions. For example, if the film has a thickness of 0.1 to 10 µm (1000 to 100000 Å), the dissolution rate in a 2.38% TMAH aqueous solution is preferably 50 to 5000 Å/second although it varies according to the kind and amount of the photosensitive agent contained in the composition.

The polysiloxane described above is, for example, (M): a polysiloxane which forms a film soluble in a 2.38 wt % TMAH aqueous solution at a dissolution rate of 200 to 3000 Å/second after prebaked.
This polysiloxane can be combined with the alkali-soluble resin so as to obtain a composition whose dissolution rate in the TMAH solution is 50 Å/second or more.

If necessary, the above polysiloxane can be mixed with (L): a polysiloxane which forms a film soluble in a 5 wt % TMAH aqueous solution at a dissolution rate of 1000 Å/second or less after prebaked, or
(H): a polysiloxane which forms a film soluble in a 2.38 wt % TMAH aqueous solution at a dissolution rate of 4000 Å/second or more after prebaked,
so as to obtain a composition having a desired dissolution rate.

The above polysiloxane (M) can be produced in a manner where a silane compound (m) selected from the group consisting of trialkoxysilanes, tetraalkoxysilanes and dialkoxysilanes is hydrolyzed in the presence of an acidic or basic catalyst and then condensed.

The silane compound (m) as a starting material may be any one selected from the group consisting of trialkoxysilanes, tetraalkoxysilanes and dialkoxysilanes. For example, it can be represented by the following formula (II):

$$R^1[Si(OR_2)_3]_p \qquad (II)$$

in which
p is an integer of 1 to 3;
$R^1$ is hydrogen or a straight, branched or cyclic hydrocarbon group which has 20 or less carbon atoms and which may contain oxygen or nitrogen, provided that any hydrogen of the hydrocarbon group may be replaced with fluorine; and
each $R^2$ is independently hydrogen or an alkyl group having 1 to 10 carbon atoms, preferably an alkyl group having 1 to 6 carbon atoms.

When $R^1$ in the formula (II) is a monovalent group (namely, p=1) other than alkoxy groups or derivatives thereof, examples of $R^1$ include methyl, ethyl, n-propyl, iso-propyl, t-butyl, n-hexyl, n-decyl, trifluoromethyl, 2,2,2-trifluoroethyl, 3,3,3-trifluoropropyl, cyclohexyl, phenyl, tollyl, glycidyl, isocyanate and amino groups. The compound having a methyl group as $R^1$ is particularly preferred because that material is easily available and further because the resultant cured film has sufficient hardness and high chemical resistance. Also preferred is a phenyl group because it enhances solubility of the polysiloxane in the solvent and makes the resultant cured film hardly suffer from cracking. Further, $R^1$ is also preferably glycidyl, isocyanate or amino group because they enhance the adhesion onto the substrate.

If $R^1$ is a divalent or trivalent group (namely, p=2 or 3) other than alkoxy groups or derivatives thereof, the silane compound (m) of the formula (II) is expediently categorized as a trialkoxysilane. In that case, $R^1$ preferably contain an alkylene, an arylene, a cycloalkyl ring, a piperidine ring, a pyrrolidine ring, an isocyanurate ring or the like.

Examples of $R^2$ in the formula (II) include methyl, ethyl, n-propyl, iso-propyl, and n-butyl groups. The formula (II) has two or more $R^2$s, which may be the same as or different from each other.

Concrete examples of the trialkoxysilane compounds represented by the formula (II) include: methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, and 3,3,3-trifluoropropyltrimethoxysilane. Among them, preferred are methyltrimethoxysilane, methyltriethoxysilane, methyltripropoxysilane and phenyltrimethoxysilane.

If $R^1$ is an alkoxy group, the silane compound represented by the formula (II) is a tetraalkoxysilane. Typical examples of the tetraalkoxysilane are represented by the formula (II) in which $R^1$ is $OR^2$, that is, $$Si(OR^2)_4 \qquad (II')$$

in which $R^2$ is the same as described above.

Examples of the tetraalkoxysilane represented by the formula (II') include tetramethoxysilane, tetraethoxysilane, tetrapropoxysilane, and tetrabutoxysilane. Among them, preferred are tetramethoxysilane and tetraethoxysilane because they have high reactivity.

For synthesis of the polysiloxane (M), the silane compound (m) may be used singly or in combination of two or more kinds thereof. If tetraalkoxysilanes are adopted as the silane compound (m), they tend to reduce thermal flow of the pattern. This is thought to be because the crosslinking density increases in the polysiloxane. However, if tetraalkoxysilanes are used too much, the silane compound may be precipitated or the sensitivity may be lowered. In view of that, if tetraalkoxysilanes are employed as a material of the polysiloxane (M), the amount thereof is preferably 40 mol % or less, more preferably 20 mol % or less, based on the total molar amount of the silane compounds.

As the material of the polysiloxane (M), dialkoxysilane compounds can be adopted in combination with trialkoxysilane and/or tetraalkoxysilane compounds, if necessary. However, if the resultant film is intended to be used for applications requiring high temperature durability, the molar content of dialkoxysilane is preferably 70 mol % or less, more preferably 40 mol % or less, based on the total molar amount of the silane compounds.

The dialkoxysilane compounds are represented by the following formula:

$$R^1{}_2Si(OR^2)_2$$

in which $R^1$ and $R^2$ are individually the same as those in the above formula (II).

Examples of the dialkoxysilane compounds represented by the above formula include: dimethoxysilane, diethoxysilane, dipropoxysilane, dibutoxysilane, dimethoxydimethylsilane, diethoxydimethylsilane, 3-(2-aminoethylamino)propyldimethoxymethylsilane, 3-aminopropyldiethoxymethylsilane, 3-aminopropyldimethoxymethylsilane, (3-chloropropyl)diethoxy(methyl)silane, (3-chloropropyl)dimethoxy(methyl)silane, cyclohexyl(dimethoxy)methylsilane, dicyclopentyl(dimethoxy)silane, diethoxydimethylsilane, diethoxydiphenylsilane, diethoxy(3-glycidyloxypropyl)methylsilane, diethoxy(methyl)phenylsilane, diethoxymethylsilane, diethoxymethylvinylsilane, diisobutyldiemthoxysilane, dimethoxydimethylsilane, dimethoxydiphenylsilane, dimethoxydi-p-tosylsilane, imethoxymethylphenylsilane, dimethoxy(methyl)silane, dimethoxymethylvinylsilane, and 3-mercaptopropyl(dimethoxy)methylsilane. Among them, preferred are dimethoxydimethylsilane, diethoxydimethylsilane, diethoxydiphenylsilane, diethoxy(methyl)phenylsilane, diethoxymethylsilane, diethoxymethylvinylsilane, diethoxymethylvinylsilane, dimethoxydiphenylsilane, dimethoxymethylphenylsilane and dimethoxymethylvinylsilane.

In view of forming a pattern, the crosslinking density index is preferably 2.5 to 6.0, more preferably 3.0 to 5.0. Here, the term "crosslinking density index" means a weighted average of the alkoxy groups. Specifically, the total molar amount of the alkoxy groups contained in the silane compounds used as the starting material of the polysiloxane was divided by that of the silane compounds to obtain the crosslinking density index.

The polysiloxane (M) can be produced, for example, by the steps of: dropping the silane compound or a mixture thereof into a reaction solvent comprising an organic solvent, a basic catalyst and water, so as to conduct hydrolysis and condensation reactions; neutralizing, purifying by washing or condensing the reaction solution, if necessary; and replacing the reaction solvent with a desired organic solvent, if necessary.

Examples of the organic solvent adoptable as the reaction solvent include: hydrocarbons, such as, hexane, toluene, xylene and benzene; ethers, such as, diethyl ether and tetrahydrofuran; esters, such as, ethyl acetate and propylene glycol monomethylethylacetate; alcohols, such as, methanol, ethanol, iso-propanol, butanol and 1,3-dipropanol; and ketones, such as, acetone, methyl ethyl ketone and methyl isobutyl ketone. Those organic solvents can be employed singly or in combination. The amount of the organic solvent is generally 0.1 to 10 times by weight, preferably 0.5 to 5 times by weight of the mixture of the silane compounds.

The temperature at which the hydrolysis and condensation reactions are conducted is generally 0 to 200° C., preferably 5 to 60° C. The temperature of the dropped silane compound may be the same as or different from that of the reaction solvent. The reaction time depends on the kind of the silane compound and the like, but is normally several tens of minutes to several tens of hours, preferably 30 minutes or more. Various conditions of the hydrolysis and condensation reactions, such as, the amount of the basic catalyst, the reaction temperature and the reaction time, are properly selected in consideration of the reaction scale and the size and shape of the reaction vessel, so as to obtain characteristics suitable for the aimed use.

Examples of the basic catalyst include: organic bases, such as, triethylamine, tripropylamine, tributylamine, tripentylamine, trihexylamine, triheptylamine, trioctylamine, diethylamine, triethanolamine, diethanolamine, and alkoxysilane having amino group; inorganic bases, such as, sodium hydroxide and potassium hydroxide; anion exchange resin; and tertiary ammonium salts, such as, tetrabutylammonium hydroxide, tetraethylammonium hydroxide, TMAH and choline. The amount of the catalyst is preferably 0.0001 to 10 times by mole of the mixture of the silane compounds. The polysiloxane synthesized by use of the basic catalyst is characterized in that it rapidly begins to cure when heated at 150° C. or more and also in that the pattern thereof can keep the shape clearly even after curing without suffering from pattern collapsing.

The degree of the hydrolysis can be controlled by how much water is added to the reaction solvent. It is generally preferred to make water react with hydrolytic alkoxy groups in the silane compound in an amount of 0.01 to 10 times by mole, preferably 0.1 to 5 times by mole of the groups. If the added amount of water is smaller than the above, the hydrolysis degree is too low to form a coating film of the composition. That is unfavorable. On the other hand, however, if it is too much, the composition easily undergoes gelation and hence has low storage stability. That is unfavorable, too. The water is preferably ion exchange water or distilled water.

After the reactions are completed, the reaction solution may be made neutral or weakly acidic by use of an acidic compound as a neutralizer. Examples of the acidic compound include: inorganic acids, such as, phosphoric acid, nitric acid, sulfuric acid, hydrochloric acid and hydrofluoric acid; and organic acids, such as, acetic acid, trifluoroacetic acid, formic acid, lactic acid, acrylic acid, multivalent carboxylic acids (e.g., oxalic acid, maleic acid, succinic acid, citric acid) and anhydrides thereof, and sulfonic acids (e.g., p-toluenesulfonic acid and methanesulfonic acid). Further, cation exchange resin can be used as a neutralizer.

The amount of the neutralizer is properly selected according to pH of the reaction solution after the reactions, but is preferably 0.5 to 1.5 times by mole, more preferably 1 to 1.1 times by mole of the basic catalyst. In the case where cation exchange resin is adopted, the number of ionic groups in the exchange resin is preferably in the above range.

According to necessity, the reaction solution after neutralized can be washed and purified. There are no particular restrictions on the way of washing. For example, hydrophobic organic solvent and water, if necessary, are added to the reaction solution after neutralized, and then the mixture was stirred and thereby the organic solvent is brought into contact with the polysiloxane so as to dissolve at least the polysiloxane in the hydrophobic organic solvent phase. As the hydrophobic organic solvent, a compound capable of dissolving the polysiloxane but immiscible with water is employed. Here, the compound "immiscible with water" means that, even if water and the compound are well mixed, the mixture separates into an aqueous phase and an organic phase while left to stand.

Preferred examples of the hydrophobic organic solvent include: ethers, such as, diethyl ether; esters, such as, ethyl acetate; alcohols having low solubility in water, such as, butanol; ketones, such as, methyl ethyl ketone and methyl isobutyl ketone; and aromatic solvents, such as, toluene and xylene. The hydrophobic organic solvent used in washing may be the same as or different from the organic solvent used as the reaction solvent, and further two or more solvents may be mixed to use. In this washing step, most of the basic catalyst used in the reactions, the neutralizer, salts formed by the neutralization, and by-products of the reactions, such as, alcohols and water, are contained in the aqueous phase and hence essentially removed from the organic phase. The times of washing can be changed according to necessity.

The temperature in washing is not particularly restricted, but is preferably 0 to 70° C., more preferably 10 to 60° C. The temperature at which the aqueous phase and the organic phase are separated is also not particularly restricted, but is preferably 0 to 70° C., more preferably 10 to 60° C. in view of shorting the time for separating the phases.

The above washing step may improve the composition in coating properties and in storage stability.

The reaction solution after washed may be directly added to the composition of the present invention, but can be condensed, if necessary, to remove the solvent and remaining by-products, such as, alcohols and water, and thereby to change the concentration. Further, the solvent may be replaced with another solvent. The solution can be condensed under normal (atmospheric) pressure or reduced pressure, and the degree of condensation can be freely changed by controlling the distilled amount. The temperature in the condensation step is generally 30 to 150° C., preferably 40 to 100° C. According to the aimed solvent composition, a desired solvent may be added and then the solution may be further condensed to replace the solvent.

In producing the polysiloxane (M), an acidic catalyst can be used as the reaction catalyst. Examples of the acidic catalyst include hydrochloric acid, nitric acid, sulfuric acid, hydrofluoric acid, phosphoric acid, acetic acid, trifluoroacetic acid, formic acid, and multivalent carboxylic acids and anhydrides thereof. The amount of the catalyst depends on the strength of the acid, but is preferably 0.0001 to 10 times by mole of the mixture of the silane compounds.

In the case where the acidic catalyst is adopted to produce the polysiloxane (M), the reaction solution may be neutralized after the reactions are completed in the same manner as in the case where the basic catalyst is adopted. In this case, however, basic compounds are employed as the neutralizer. Examples of the basic compounds used for neutralization include: organic bases, such as, triethylamine, tripropylamine, tributylamine, tripentylamine, trihexylamine, triheptylamine, trioctylamine, diethylamine, triethanolamine, and diethanolamine; inorganic bases, such as, sodium hydroxide and potassium hydroxide; and tertiary ammonium salts, such as, tetrabutylammonium hydroxide, tetraethylammonium hydroxide, and TMAH. In addition, anion exchange resin is also employable. The amount of the neutralizer may be the same as that in the case where the basic catalyst is adopted. Specifically, that is properly selected according to pH of the reaction solution after the reactions, but is preferably 0.5 to 1.5 times by mole, more preferably 1 to 1.1 times by mole of the acidic catalyst.

In the above manner, the polysiloxane (M) usable in the composition of the present invention can be produced.

The polysiloxanes (L) and (H) can be produced in the same manner as that of (M). In order to realize the aimed dissolution rate, the conditions, such as, the reaction solvent, particularly, the amount of added water, the reaction time, and the reaction temperature, are properly controlled. However, it is noted that the polysiloxane (L) is produced by use of the basic catalyst because, if the acidic catalyst is used, the coating film tends to suffer from thermal flow when cured.

If used as the material for the polysiloxane (M) in a relatively large amount, tetraalkoxysilanes are preferably employed in a small amount for the polysiloxane (L) or (H). That is because, if the total amount thereof is large, the silane compound may be precipitated or the sensitivity may be lowered. The amount of tetraalkoxysilanes is preferably 40 mol % or less, more preferably 20 wt % or less, based on the total molar amount of the silane compounds (m), (h) and (l), which are materials of the polysiloxanes (M), (H) and (L), respectively.

The polysiloxane has a weight average molecular weight of preferably 800 to 15000, more preferably 1000 to 10000. If a mixture of the polysiloxanes is employed, each polysiloxane has a weight average molecular weight in the above range. Here, the "weight average molecular weight" means a polystyrene-reduced weight average molecular weight determined by gel permission chromatography.

In the present invention, the polysiloxane has a specific dissolution rate in a TMAH aqueous solution. The dissolution rate of polysiloxane in a TMAH aqueous solution is measured in the following manner. First, the polysiloxane is diluted with propyleneglycol monomethyletheracetate (hereinafter, referred to as "PGMEA") to be 35 wt %, and stirred and dissolved with a stirrer for 1 hour at room temperature. In a clean-room under an atmosphere of temperature: 23.0±0.5° C. and humidity: 50±5.0%, the prepared polysiloxane solution is then dropped with a pipet in an amount of 1 cc onto a 4-inch silicon wafer of 525 μm thickness at the center area, and spin-coated to form a coating of 2±0.1 μm thickness. Thereafter, the coating is pre-baked for 90 seconds on a hot-plate at 100° C. to remove the solvent. The thickness of the coating is then measured with a spectro-ellipsometer (manufactured by J. A. Woollam).

Subsequently, the silicon wafer covered with the coating is placed in a 6 inch-diameter glass petri dish filled with 100 ml of a TMAH aqueous solution of predetermined concentration at 23.0±0.1° C., and left to be immersed. The time it takes for the coating to disappear is measured. The concentration of the TMAH solution is changed according to the kind of the polysiloxane. Specifically, it is 2.38% for the polysiloxane (H), the polysiloxane (M) or the mixture of (H), (M) and (L), but is 5% for polysiloxane (L). The dissolution rate is obtained by dividing the initial thickness of the coating by the time it takes for the coating to dissolve and disappear in the area from the wafer edge to 10-mm inside. Otherwise, in the case where the dissolution rate is extremely slow, the wafer is immersed in the TMAH aqueous solution for a predetermined time and then heated for 5 minutes on a hot-plate at 200° C. to remove water soaked in the coating during the measurement of dissolution rate, and thereafter the thickness of the coating is measured. The thickness change between before and after the immersion is divided by the immersing time to obtain the dissolution rate. The measurement is repeated five times and the obtained values are averaged to determine the dissolution rate of the polysiloxane.

(III) Diazonaphthoquinone Derivative

The composition according to the present invention contains a diazonaphthoquinone derivative. In the exposed area, the composition containing the derivative becomes soluble in an alkali developer and thereby is removed by development to form a positive type image. The composition of the present invention thus generally functions as a positive type photoresist composition. The diazonaphthoquinone derivative of the present invention can be regarded as a compound in which a naphthoquinone diazide sulfonic acid is ester-bonded with a phenolic hydroxyl-containing compound. There are no particular restrictions on the structure thereof, but the derivative is preferably an ester compound formed by esterification of a compound having one or more phenolic hydroxyl groups. Examples of the naphthoquinone diazide sulfonic acid include: 4-naphthoquinone diazide sulfonic acid and 5-naphthoquinone diazide sulfonic acid. Because of having an absorption band in the i-line region (wavelength: 365 nm), 4-naphthoquinone diazide sulfonate is suitable for i-line exposure. On the other hand, 5-naphthoquinone diazide sulfonate is suitable for exposure in a wide wavelength range because absorbing light in a wide wavelength region. Accordingly, it is preferred to select 4-naphthoquinone diazide sulfonate or 5-naphthoquinone diazide sulfonate according to the exposure wavelength. It is also possible to use both 4-naphthoquinone diazide sulfonate and 5-naphthoquinone diazide sulfonate in a mixture.

There are no particular restriction on the phenolic hydroxyl-containing compound. Examples thereof include the following compounds ([trademark], manufactured by Honshu Chemical Industry Co., Ltd.):

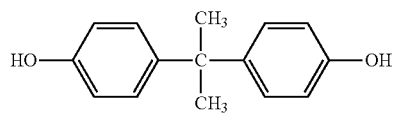

Bisphenol A

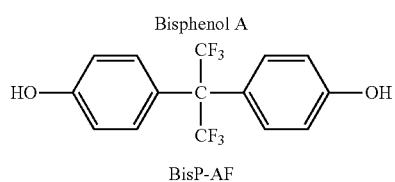

BisP-AF

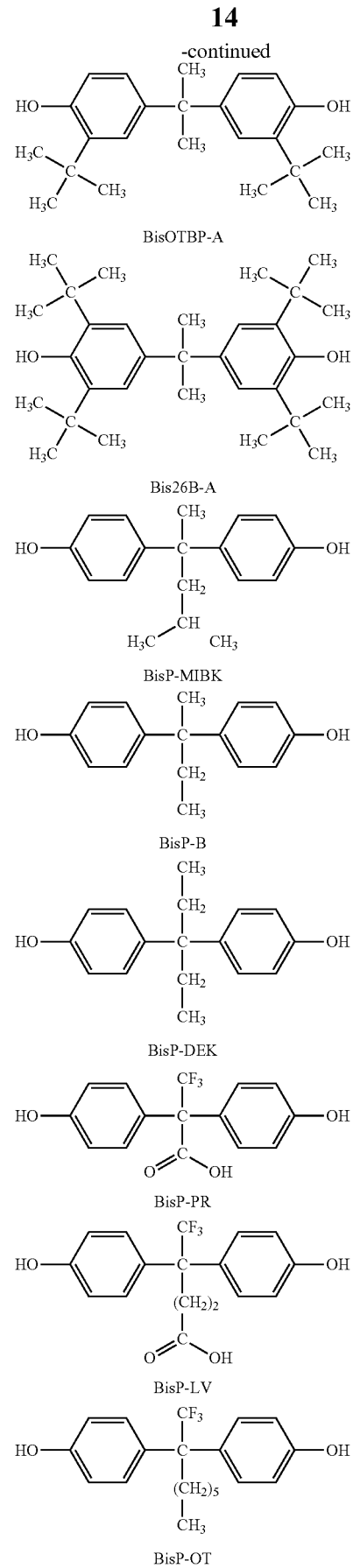

BisOTBP-A

Bis26B-A

BisP-MIBK

BisP-B

BisP-DEK

BisP-PR

BisP-LV

BisP-OT

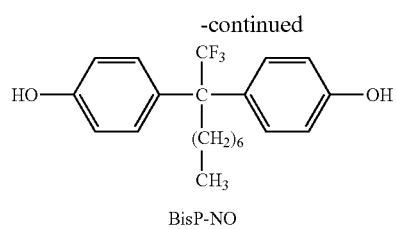
BisP-NO
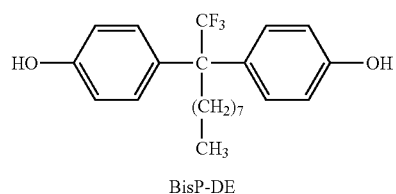
BisP-DE
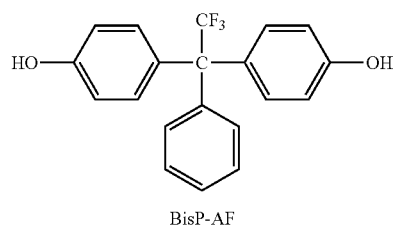
BisP-AF
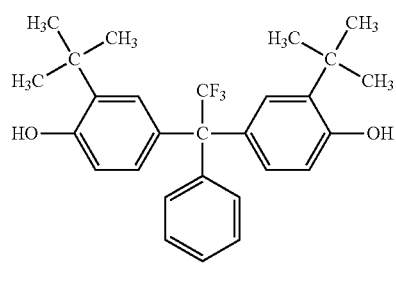
BisOTBP-AF
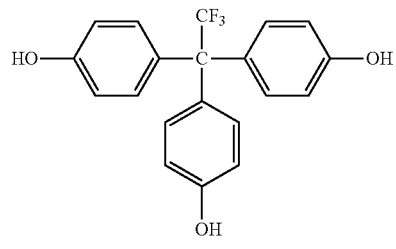
TrisP-HAP
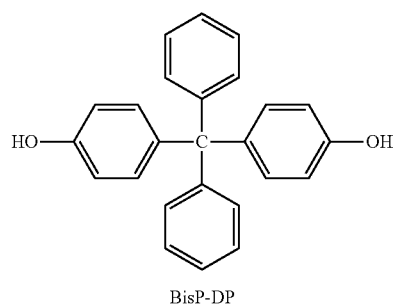
BisP-DP
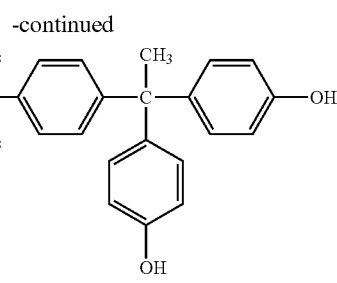
TrisP-PA
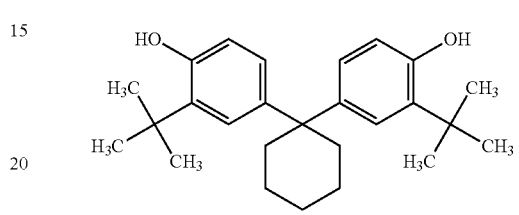
BisOTBP-Z
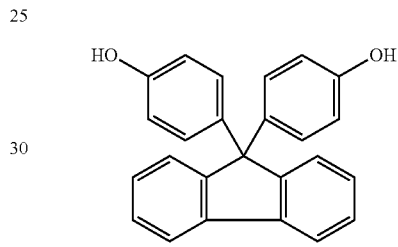
BisP-FL
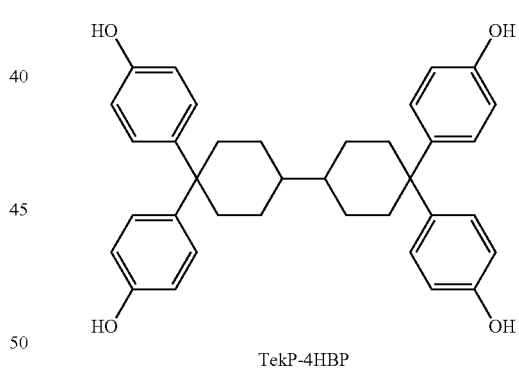
TekP-4HBP
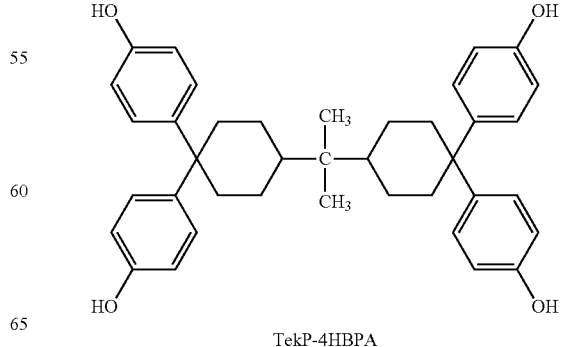
TekP-4HBPA

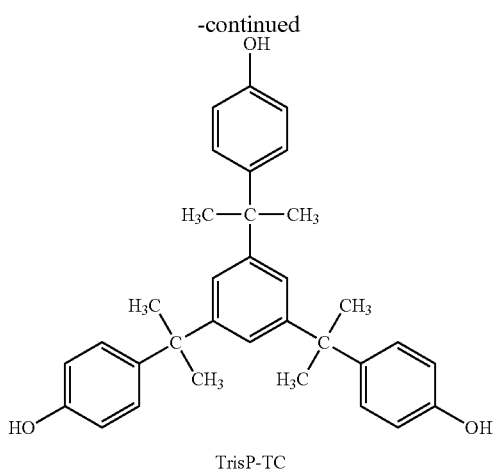

TrisP-TC

The optimal added amount of the diazonaphthoquinone derivative depends on the esterification ratio of naphthoquinone diazide sulfonic acid, on properties of the adopted polysiloxane and the alkali-soluble resin, on the required sensitivity and on the required dissolution contrast between the exposed and unexposed areas. However, it is preferably 1 to 20 wt %, more preferably 2 to 15 wt %, based the total weight of the polysiloxane and the alkali-soluble resin. If the amount is less than 1 wt %, the dissolution contrast between the exposed and unexposed areas is too low to obtain practical photosensitivity. For realizing favorable dissolution contrast, the amount is preferably 2 wt % or more. If it is more than 20 wt %, the compatibility between the quinone diazide compound and the polysiloxanes and between the compound and the alkali-soluble resin is so lowered that the coating film may be whitened. Further, when thermally cured, the formed film may be seriously colored by decomposition of the quinone diazide compound. As a result, the colorless transparency of the film may be impaired. Furthermore, the diazonaphthoquinone derivative is inferior to the polysiloxane in heat resistance, and hence if contained too much, the derivative may thermally decompose to lower the electric insulation of the cured film or to emit such gases as cause troubles in the post-treatments. Still further, it often deteriorates resistance of the cured film against a photoresist remover containing monoethanolamine or the like as a main ingredient.

(IV) Compound Generating Acid or Base when Exposed to Heat or Light

The composition according to the present invention contains a compound generating acid or base when exposed to heat or light (hereinafter, often referred to as "the present compound" for simplification). The present compound can be roughly categorized into the following four agents, that is, (i) a photo acid-generator, which decomposes to release an acid when exposed to light;
(ii) a photo base-generator, which decomposes to release a base when exposed to light;
(iii) a heat acid-generator, which decomposes to release an acid when exposed to heat; and
    (iv) a heat base-generator, which decomposes to release a base when exposed to heat.

Those are selected according to the polymerization and/or crosslinking reactions adopted in the process for producing a cured film. Examples of the light include visible light, ultraviolet rays, infrared rays, X rays, electron beams, α-rays, and γ-rays.

The photo acid- or base-generator generates an acid or base, respectively, when exposed to light, and the generated acid or base is thought to contribute toward polymerization of the polysiloxane and the alkali-soluble resin. The process for forming, for example, a positive type pattern from the composition of the present invention generally comprises: coating a substrate with the composition to form a coating film, exposing the film to light, and then developing the film with an alkali developer to remove the exposed part thereof. The present compound preferably generates an acid or base not in the above exposure (hereinafter, referred to as "first exposure") but in a second exposure carried out thereafter, and hence preferably has little absorption in the wavelength region of the light used in the first exposure. For example, if the first exposure is carried out at g-line (peak wavelength: 436 nm) and/or h-line (peak wavelength: 405 nm) and thereafter the second exposure is carried out at g+h+i lines (peak wavelength: 365 nm), the photo acid- or base-generator preferably has a larger absorbance at 365 nm than at 436 nm and/or at 405 nm. Specifically, the absorbance ratio at 365 nm/436 nm or at 365 nm/405 nm is preferably 5/1 or more, further preferably 10/1 or more, furthermore preferably 100/1 or more.

The heat acid- or base-generator generates an acid or base, respectively, in post-baking. The generated acid or base is thought to contribute toward polymerization of the polysiloxane in post-baking.

The optimal added amount of the present compound depends on the kind and amount of the active substances generated by decomposition of the compound, on the required sensitivity and on the required dissolution contrast between the exposed and unexposed areas, but is preferably 0.1 to 10 weight parts, more preferably 0.5 to 5 weight parts based on 100 weight parts in total of the polysiloxane and the alkali-soluble resin. If it is less than 0.1 weight part, the acid or base is generated in too small an amount to promote the polymerization in post-baking, and consequently pattern collapse may occur. On the other hand, if it is more than 10 weight parts, the formed film may suffer from cracks or may be colored by decomposition of the present compound so seriously that the colorless transparency of the coating film may be impaired. Further, if the present compound is contained too much, the thermally decomposed product thereof may lower the electric insulation of the cured film or may release gases to cause troubles in the post-treatments. Furthermore, it often deteriorates resistance of the coating film against a photoresist remover containing monoethanolamine or the like as a main ingredient.

The above photo acid-generator can be freely selected from those generally used, and examples thereof include diazomethane compounds, triazine compounds, sulfonic acid esters, diphenyliodonium salts, triphenylsulfonium salts, sulfonium salts, ammonium salts, phosphonium salts, sulfonimide compounds.

In addition to the above, examples of the employable photo acid-generator include: 4-methoxyphenyldiphenylsulfonium hexafluorophosphonate, 4-methoxyphenyldiphenylsulfonium hexafluoroacetate, 4-methoxyphenyldiphenylsulfonium methanesulfonate, 4-methoxyphenyldiphenylsulfonium trifluoroacetate, triphenylsulfonium tertafluoroborate, triphenylsulfonium tetrakis(pentafluorophenyl)borate, triphenylsulfonium hexafluorophosphonate, triphenylsulfonium hexafluoroacetate, 4-methoxyphenyldiphenylsulfonium-p-toluenesulfonate, 4-phenylthiophenyldiphenyl tetrafluoroborate, 4-phenylthiophenyldiphenyl hexafluorophosphonate, triphenylsulfonium methanesulfonate, triphenylsulfonium trifluoroacetate, triphenylsulfonium-p-toluenesulfonate, 4-methoxyphenyl-diphenylsulfonium tertafluoroborate, 4-phenylthiophenyldi-phenyl hexafluoroacetate, 4-phenylthiophenyldiphenyl-p-toluenesulfonate, N-(trifluoromethylsulfonyloxy) succinimide, N-(trifluoromethylsulfonyloxy)phthalimide, 5-norbornene-2,3-dicarboxyimidyl triflate, 5-norbornene-2,3-dicarboxyimidyl-p-toluenesulfonate, 4-phenylthiophenyl-diphenyl trifluoromethanesulfonate, 4-phenylthiophenyldi-phenyl trifluoroacetate, N-(trifluoromethylsulfonyloxy) diphenylmaleimide, N-(trifluoromethylsulfonyloxy)bicyclo [2.2,1]hept-5-ene-2,3-dicarboximide, N-(trifluoromethylsulfonyloxy)naphthylimide, and N-(non-aflurorobutylsulfonyloxy)naphthylimide.

Some generators have absorption in the wavelength range of h-line, and hence it should be avoided to adopt them if the resultant film is intended to have no absorption in the h-line wavelength range. Examples of those generators include 5-propylsulfonyloxyimino-5H-thiophene-2-ylidene)-(2-methylphenyl)acetonitrile, 5-octylsulfonyloxyimino-5H-thiophene-2-ylidene)-(2-methylphenyl)acetonitrile, 5-cam-phorsulfonyloxyimino-5H-thiophene-2-ylidene)-(2-methylphenyl)acetonitrile, and 5-methylphenylsulfonyloxyimino-5H-thiophene-2-ylidene)-(2-methylphenyl)acetonitrile.

Examples of the above photo base-generator include multi-substituted amido compounds having amido groups, lactams, imido compounds, and compounds containing the structures thereof.

Among them, it is preferred to adopt a hydrate or solvate of a photo base-generator represented by the following formula (A):

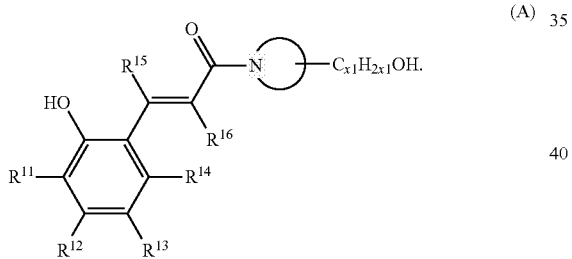

That is because the above photo base-generator improves storage stability of the composition. In the above formula, X1 is an integer of 1 to 6 inclusive, and each of $R^{11}$ to $R^{16}$ is independently hydrogen, a halogen, hydroxyl, mercapto, sulfide, silyl, silanol, nitro, nitroso, sulfino, sulfo, sulfonate, phosphino, phosphinyl, phosphono, phosphonato, amino, ammonium, an aliphatic hydrocarbon group of 1 to 20 carbon atoms which may have a substituent, an aromatic hydrocarbon group of 6 to 22 carbon atoms which may have a substituent, an alkoxy group of 1 to 20 carbon atoms which may have a substituent, or an aryloxy group of 6 to 20 carbon atoms which may have a substituent.

Among the above, each of $R^{11}$ to $R^{14}$ is preferably independently hydrogen, hydroxyl, an aliphatic hydrocarbon group of 1 to 6 carbon atoms, or an alkoxy group of 1 to 6 carbon atoms; and each of $R^{15}$ and $R^{16}$ is particularly preferably hydrogen.

Two or more of $R^{11}$ to $R^{14}$ may be linked to form a cyclic structure, and the cyclic structure may contain a hetero atom.

In the above formula, N is a constituting atom of a nitrogen-containing heterocyclic ring having one or more hydroxyalkyl groups and the nitrogen-containing heterocy-clic ring is a 3 to 10-membered ring. The hydroxyalkyl group may be placed at any position of the ring, but is preferably connected to the p- or o-position. Further, the nitrogen-containing heterocyclic ring may have an aliphatic hydrocarbon group of 1 to 20, preferably 1 to 6 carbon atoms which may have a substituent, provided that the aliphatic hydrocarbon group is different from the above hydroxyalkyl group. The nitrogen-containing heterocyclic ring preferably has a hydroxyl group as the substituent because the solubility and the boiling point are both increased.

Each of $R^{11}$ to $R^{14}$ is preferably selected according to the employed exposure wavelength. For use in a display device, preferred are alkoxy groups, nitro group and unsaturated hydrocarbon-linking functional groups, such as vinyl and alkynyl, which have a function of shifting the absorption wavelength to the g-, h- or i-line region. Among those, methoxy and ethoxy are particularly preferred.

Examples of the photo base-generator represented by the formula (A) are as follows:

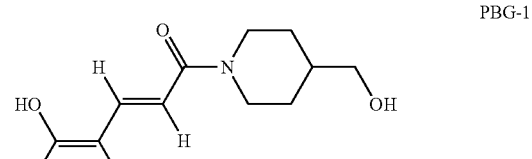

PBG-1

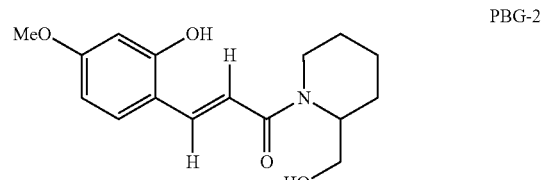

PBG-2

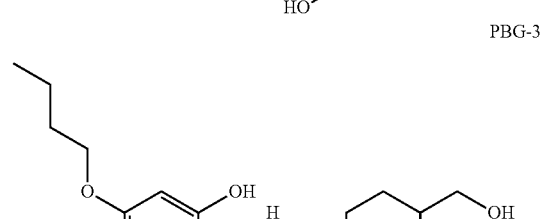

PBG-3

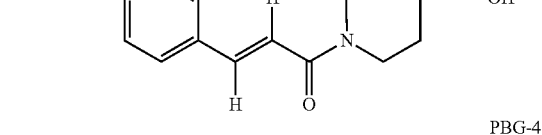

PBG-4

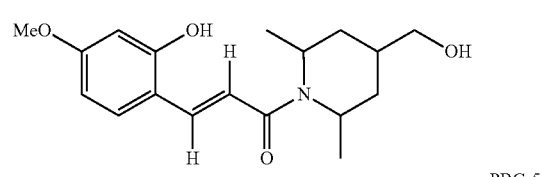

PBG-5

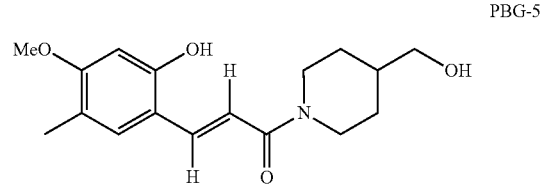

The above heat acid-generator is, for example, a salt or ester capable of generating an organic acid. Examples thereof include: various aliphatic sulfonic acids and salts thereof; various aliphatic carboxylic acids, such as, citric acid, acetic acid and maleic acid, and salts thereof; various aromatic carboxylic acids, such as, benzoic acid and phthalic acid, and salts thereof; aromatic sulfonic acids and ammonium salts, various amine salts and aromatic diazonium salts thereof; and phosphonic acids and salts thereof. The heat acid-generator employed in the present invention is preferably a salt of organic acid and organic base, more preferably a salt of sulfonic acid and organic base.

Examples of the preferred sulfonic acid include: p-toluenesulfonic acid, benzenesulfonic acid, p-dodecylbenzenesulfonic acid, 1,4-naphthalenedisulfonic acid, and methanesulfonic acid. Those heat acid-generators can be used singly or in combination.

The above heat base-generator is, for example, a compound capable of generating a base, such as, imidazole, a tertiary amine or a quaternary amine, or may be a mixture of that kind of compounds. Examples of the based emitted from the generator include: imidazole derivatives, such as, N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, and N-(4-chloro-2-nitrobenzyloxycarbonyl)imidazole; and 1,8-diazabicyclo(5,4,0)undecane-7. Like the heat acid-generators, those heat base-generators can be used singly or in combination.

(V) Solvent

The composition according to the present invention contains a solvent. There are no particular restrictions on the solvent as long as it can homogeneously dissolve or disperse the above polysiloxane, the above alkali-soluble resin, the above diazonaphthoquinone derivative, the above compound generating acid or base when exposed to heat or light, and additives incorporated optionally. Examples of the solvent usable in the present invention include: ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol monoalkyl ethers, such as propylene glycol monomethyl ether and propylene glycol monoethyl ether; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; alcohols, such as, ethanol, propanol, butanol, hexanol, cyclohexanol, ethylene glycol, and glycerin; esters, such as, ethyl lactate, ethyl 3-ethoxypropionate, and methyl 3-methoxypropionate; and cyclic asters, such as, γ-butyrolactone. Those solvents can be used singly or in combination of two or more, and the amount thereof depends on the coating method and on the required thickness of the coating film.

The amount of the solvent in the composition according to the present invention can be freely controlled according to the method of coating the composition. For example, if the composition is intended to be coated by spray coating, it can contain the solvent in an amount of 90 wt % or more. Further, if a slit-coating method, which is often adopted in coating a large substrate, is intended to be carried out, the content of the solvent is normally 60 wt % or more, preferably 70 wt % or more. However, the amount of the solvent gives little effect to the characteristics of the composition of the present invention.

The composition of the present invention necessarily comprises the above (I) to (V), but can further comprise optional compounds in combination, if needed. Those combinable substances will be described below. The total amount of the ingredients other than (I) to (V) is preferably 10% or less, more preferably 5% or less based on the whole weight.

(VI) Additives

The composition of the present invention may contain other additives, if necessary. Examples of the additives include developer-dissolution promoter, scum remover, adhesion enhancer, polymerization inhibitor, defoaming agent, surfactant, sensitizer, crosslinking agent and colorant.

The developer-dissolution promoter or the scum remover has functions of controlling solubility of the formed coating film in a developer and of preventing scum from remaining on the substrate after development. As this additive, crown ethers can be adopted. Crown ethers having the simplest structures are represented by the general formula: (—$CH_2$—$CH_2$—O—)$_n$. Among them, crown ethers of the formula in which n is 4 to 7 are preferably used in the present invention. Meanwhile, crown ethers are often individually referred to as "x-crown-y-ether" in which x and y represent the total number of atoms forming the ring and the number of oxygen atoms included therein, respectively. In the present invention, the additive is preferably selected from the group consisting of crown ethers of X=12, 15, 18 and 21 and y=x/3, benzo-condensed products thereof, and cyclohexyl-condensed products thereof. Preferred examples of the crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Among them, it is particularly preferred to select the additive from the group consisting of 18-crown-6-ether and 15-crown-5-ether. The amount thereof is preferably 0.05 to 15 weight parts, more preferably 0.1 to 10 weight parts, based on 100 weight parts in total of the polysiloxane and the alkali-soluble resin.

In the process for forming a cured film from the composition of the present invention, the adhesion enhancer has a function of preventing a pattern of the film from being peeled off by stress formed after curing. As the adhesion enhancer, imidazoles and silane coupling agents are preferably adopted. Examples of the imidazoles include 2-hydroxybenzimidazole, 2-hydroxyethylbenzimidazole, benzimidazole, 2-hydroxyimidazole, imidazole, 2-mercaptoimidazole, and 2-aminoimidazole. Among them, particularly preferred are 2-hydroxybenzimidazole, benzimidazole, 2-hydroxyimidazole and imidazole.

As the silane coupling agents, known compounds, such as, epoxy-silane coupling agents, amino-silane coupling agents and mercapto-silane coupling agents, can be preferably adopted. Examples thereof include 3-glycidoxypropyltrimethoxysilane, 3-glycidoxypropyltriethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-ureidopropyltriethoxysilane, 3-chloropropyltriethoxysilane, 3-mercaptopropyltrimethoxysilane, and 3-isocyanatepropyltriethoxysilane. Those can be used singly or in combination of two or more. The amount thereof is preferably 0.05 to 15 weight parts based on 100 weight parts in total of the polysiloxane and the alkali-soluble resin.

Further, as the silane coupling agents, acid group-containing silane or siloxane compounds are also employable. Examples of the acid group include carboxyl group, an acid anhydride group, and phenolic hydroxyl group. If having a monobasic acid group such as carboxyl or phenolic hydroxyl group, the compound is preferably a single silane coupling agent having two or more acid groups.

Examples of the silane coupling agents include compounds represented by the following formula (B):

$$R^1[Si(OR^2)_3]_p \quad (B)$$

and polymers having polymerization units derived from them.

In the above formula, p is 1 to 3;

$R^1$ is hydrogen or a p-valent straight, branched or cyclic hydrocarbon group which has 20 or less carbon atoms and which may contain oxygen or nitrogen, provided that any hydrogen of the hydrocarbon group may be replaced with fluorine; and each $R^2$ is independently hydrogen or an alkyl group having 1 to 10 carbon atoms, preferably an alkyl group having 1 to 6 carbon atoms.

Preferred examples of the agents include: the aforementioned silane compounds; compounds of the formula (B) in which $R^1$ and $R^2$ are a carboxylic anhydride group and methyl, respectively; and compounds represented by the formula (B) with p=1, such as, an acid anhydride group-containing silicone. Examples of the acid anhydride group-containing silicone include: a compound represented by the following formula (B-1) (X-12-967C [trademark], manufactured by Shin-Etsu Chemical Co., Ltd.); a silicon-containing polymer, such as silicone, which has a structure corresponding to the formula at the terminal or in the side chain; and a compound of dimethylsilicone having a terminal modified with an acid group, such as, thiol, phosphonium, borate, carboxyl, phenol, peroxide, nitro, cyano or sulfo group. Examples thereof include compounds represented by the following formulas (B-2) and (B-3) (X-22-2290AS and X-22-1821 [trademarks], manufactured by Shin-Etsu Chemical Co., Ltd.).

If the silane coupling agent contains a silicone structure and has too large a molecular weight, it may has poor compatibility with the polysiloxane in the composition. Consequently, there are possibilities, for example, that the coating film is insufficiently dissolved in a developer and that the reactive groups are left in the film and thus the film cannot have enough chemical resistance in post-treatments. In view of that, the silane coupling agent has a weight average molecular weight of preferably 1000 or less. The amount thereof is preferably 0.01 to 15 weight parts based on 100 weight parts in total of the polysiloxane and the alkali-soluble resin.

Examples of the polymerization inhibitor include nitrone, nitroxide radical, hydroquinone, catechol, phenothiazine, phenoxazine, hindered amine, derivatives thereof, and UV absorbers. Among them, preferred are methylhydroquinone, catechol, 4-t-butylcatechol, 3-methoxycatechol, phenothiazine, chlorpromazine, phenoxazine, hindered amines such as TINUVIN 144, 292 and 5100 ([trademarks], manufactured by BASF), and UV absorbers such as TINUVIN 326, 328, 384-2, 400 and 477 ([trademarks], manufactured by BASF). Those can be used singly or in combination of two or more. The amount thereof is preferably 0.01 to 20 weight parts based on 100 weight parts in total of the polysiloxane and the alkali-soluble resin.

Examples of the defoaming agent include: alcohols ($C_1$ to $C_{18}$); higher fatty acids, such as, oleic acid and stearic acid; higher fatty acid esters, such as, glycerin monolaurate; polyethers, such as, polyethylenglycol (PEG) (Mn: 200 to 10000) and polypropyleneglycol (PPG) (Mn: 200 to 10000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 weight parts based on 100 weight parts in total of the polysiloxane and the alkali-soluble resin.

If necessary, the composition of the present invention can further contain a surfactant, which is incorporated with the aim of improving coating properties, developability and the like. The surfactants usable in the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene alcohol derivatives, such as polyethoxyate of acetylene alcohols, acetylene glycol; acetylene glycol derivatives such as polyethoxyate of acetylene glycols; fluorine-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammo-

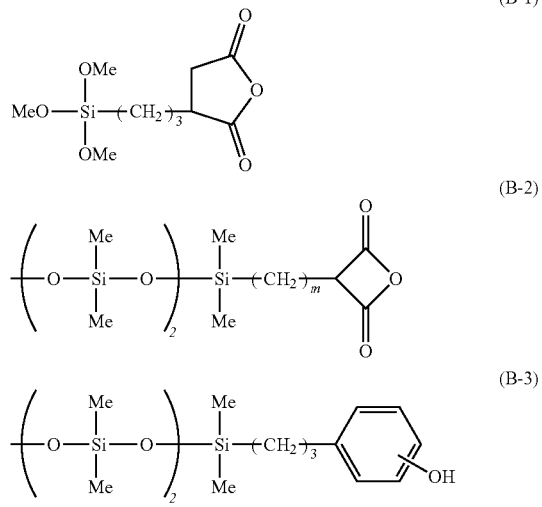

nium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 10000 ppm, preferably 100 to 8000 ppm based on the composition of the present invention.

According to necessity, a sensitizer can be incorporated into the composition of the present invention. The sensitizer must be appropriately selected in consideration of the absorption wavelength of the photo acid- or base-generator and the exposure wavelength.

Examples of the sensitizer preferably used in the composition of the present invention include coumarin, ketocoumarin, derivatives thereof, thiopyrylium salts, and acetophenone. Specifically, concrete examples thereof include: sensitizing dyes, such as, p-bis(o-methylstryl)benzene, 7-dimethylamino-4-methylquinolone-2,7-amino-4-methylcoumarin, 4,6-dimethyl-7-ethylaminocoumarin, 2-(p-dimethylaminostryl)pyridylmethyl iodide, 7-diethylaminocoumarin, 7-diethylamino-4-methylcoumarin, 2,3,5,6-1H,4H-tetrahydro-8-methylquinolidino-<9,9a,1gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolidino<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolidino-<9,9a,1-gh>coumarin, 3-(2'-N-methylbenzimidazolyl)-7-N,N-diethylamino coumarin, N-methyl-4-trifluoromethylpiperidino-<3,2-g>coumarin, 2-(p-dimethylaminostryl)benzothiazolylethyl iodide, 3-(2'-benzimidazolyl)-7-N,N-diethylaminocoumarin, 3-(2'-benzothiazolyl)-7-N,N-diethylaminocoumarin, and pyrylium or thiopyrylium salts represented by the following formula. The sensitizing dye makes it possible to carry out patterning by use of inexpensive light sources, such as, a high-pressure mercury lamp (360 to 430 nm). The amount thereof is preferably 0.05 to 15 weight parts, more preferably 0.1 to 10 weight parts based on 100 weight parts in total of the polysiloxane and the alkali-soluble resin.

As the sensitizer, it is also possible to adopt a compound having an anthracene skeleton. Concrete examples thereof include compounds represented by the following formula (C):

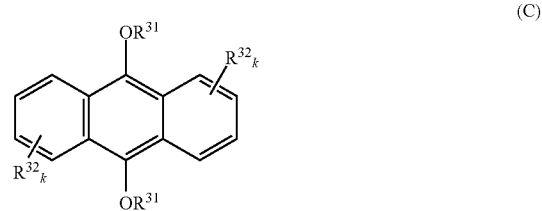

(C)

in which
each $R^{31}$ is independently a substituent group selected from the group consisting of alkyl groups, aralkyl groups, aryl groups, hydroxyalkyl groups, alkoxyalkyl groups, glycidyl groups and halogenated alkyl groups;
each $R^{32}$ is independently a substituent group selected from the group consisting of hydrogen, alkyl groups, alkoxy groups, halogen atoms, nitro groups, sulfonic acid groups, hydroxyl group, amino groups, and carbalkoxy groups; and
each k is independently an integer of 0 or 1 to 4.

When the sensitizer having an anthracene skeleton is added, the amount thereof is preferably 0.01 to 5 weight parts based on 100 weight parts in total of the polysiloxane and the alkali-soluble resin.

Further, if necessary, a stabilizer can be also added into the composition of the present invention. The stabilizer can be freely selected from those generally known. However, in the present invention, aromatic amines are preferred because they have high effect on stabilization. Among those aromatic amines, preferred are pyridine derivatives and particularly preferred are pyridine derivatives having bulky substituent groups at 2- and 6-positions. Concrete examples thereof are as follows:

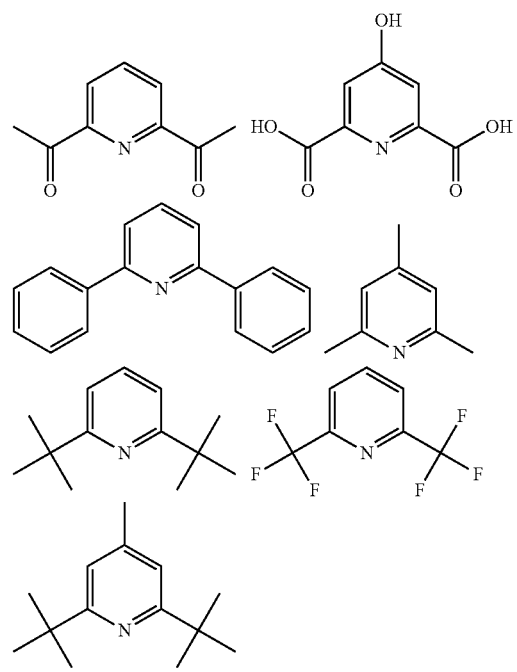

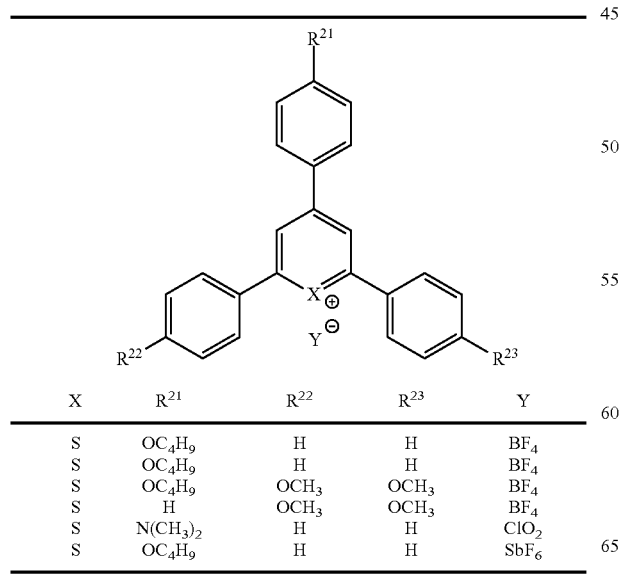

| X | $R^{21}$ | $R^{22}$ | $R^{23}$ | Y |
|---|---|---|---|---|
| S | $OC_4H_9$ | H | H | $BF_4$ |
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| S | $OC_4H_9$ | H | H | $SbF_6$ |

According to necessity, a crosslinking agent can be incorporated into the composition of the present invention. Examples of the crosslinking agent include melamine or isocyanate compounds having methylol or alkoxylmethyl groups. Concrete examples of the melamine compounds include: NIKALAC MW-390, MW-100LM, MX-750LM, MX-270, and MX-280, which have imino, methylol or methoxymethyl groups. Concrete examples of the isocyanate compounds include: KBM-9659, X-12-9659 and KBM-585 ([trademarks], manufactured by Shin-Etsu Chemical Co., Ltd.). Also preferred are polymers including those structures, which may be partly substituted with silicone groups. Further, hexamethylene diisocyanate, cyclohexane diisocyanate, and Karenz AOI, Karenz MOI-BM, Karenz MOI-BP and Karenz BEI ([trademarks], manufactured by SHOWA DENKO K.K.) can be employed.

The amount of the crosslinking agent is 0 to 50 weight parts, preferably 2 to 50 weight parts, more preferably 5 to 20 weight parts based on 100 weight parts in total of the polysiloxane and the alkali-soluble resin. If it is 5 weight parts or more, the resolution can be sufficiently improved. On the other hand, if it is 50 weight parts or less, there is little fear that gaps in the pattern are buried to lower the resolution. The above compounds can be used singly or in mixture of two or more.

Further, according to necessity, a colorant can be incorporated into the composition of the present invention. Various known organic and inorganic colorants are employable, but inorganic colorants are preferred in view of the heat resistance. Examples thereof include carbon black, titanium black pigment, iron oxide pigment, and composite metal oxide pigment.

The amount of the colorant is preferably 0.1 to 50 weight parts based on 100 weight parts in total of the polysiloxane and the alkali-soluble resin. If it is less than 0.1 weight part, sufficient light-shielding effect cannot be obtained. On the other hand, if it is more than 50 weight parts, light-shielding effect may be so large that the photosensitive material cannot be exposed enough to obtain a pattern.

Method for Forming a Cured Film

The cured film-formation method according to the present invention comprises: coating the above composition on a substrate surface, to form a coating film; and heating to cure the film. The cured film-formation method will be explained below in the order of the steps.

(1) Coating Step

First, the above composition is coated on a substrate to form a coating film. In the present invention, the coating film can be formed in any known manner for coating a photosensitive composition. Specifically, the coating method can be freely selected from, for example, immersion coating, roll coating, bar coating, brush coating, spray coating, doctor coating, flow coating, spin coating, or slit coating. The substrate to be coated with the composition can be also properly selected from, for example, a silicon substrate, a glass substrate or a resin film. According to necessity, those substrates may be equipped with various semiconductor elements and the like formed thereon. If the substrate is in the form of a film, the coating film can be formed by gravure coating. If desired, a drying step can be independently carried out after coating. Further, according to necessity, the coating step may be repeatedly carried out once or twice or more so as to form a film of desired thickness.

(2) Prebaking Step

After the composition is coated to form a coating film, the film is preferably subjected to prebaking (preheating treatment) for the purposes of drying the film and of reducing the solvent left therein. The prebaking step is carried out at a temperature of generally 70 to 150° C., preferably 90 to 120° C. for 10 to 300 seconds, preferably 30 to 120 seconds on a hot-plate or for 1 to 30 minutes in a clean oven.

(3) Exposing Step

After the coating film is formed, the surface thereof is exposed to light. For the purpose of distinguishing this step from the flood exposure step carried out later, this step is often referred to as "first exposure". As a light source for the exposure, it is possible to adopt any light source used in conventional pattern-formation processes. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. As described above, in that case, it is advantageous to combine a sensitizing dye with the composition of the present invention.

Energy of the exposure light depends on the light source and the thickness of the coating film, but is generally 5 to 2000 mJ/cm$^2$, preferably 10 to 1000 mJ/cm$^2$. If the exposure energy is lower than 10 mJ/cm$^2$, it is often difficult to obtain satisfying resolution. On the other hand, however, if it is more than 2000 mJ/cm$^2$, the coating film is exposed so excessively that the exposure may cause halation.

In order that the coating film can be imagewise exposed to light, common photomasks are employable. Any photomask can be selected from known ones. There are no particular restrictions on the environmental conditions in the exposure, and the exposure can be carried out under an ambient atmosphere (the normal atmosphere) or under a nitrogen atmosphere. If a coating film is intended to be formed on the whole surface of the substrate, the whole substrate surface is exposed to light. In the present invention, the term "pattern film" includes a film thus formed on the whole surface of the substrate.

(4) Post-Exposure Baking Step

After the exposing step, post-exposure baking can be carried out according to necessity with the aim of encouraging the reaction initiator generated in the exposed area to cause dissolution contrast between the exposed and unexposed areas. This heating treatment differs from the below-described heating step (7) in that it is not for the purpose of curing the coating film completely but for the purpose of making it possible to leave a desired pattern on the substrate after development and to remove the part other than the pattern by development. The post-exposure baking step is, therefore, not indispensable in the present invention, and is normally not carried out if the heat acid- or base-generator is employed.

When the post-exposure baking step is carried out, it is possible to use a hot-plate, an oven, a furnace or the like. The heating temperature should not be too high because it is unfavorable for acid generated by exposure in the exposed area to diffuse into the unexposed area. In view of that, the temperature of post-exposure baking is preferably 40 to 150° C., more preferably 60 to 120° C. If necessary, the temperature may be step-by-step increased so as to control the curing speed of the composition. There are no particular restrictions on the atmosphere of baking. In order to control the curing speed of the composition, the atmosphere can be selected from, for example, an atmosphere of inert gas such as nitrogen gas, a vacuum atmosphere, a reduced-pressure atmosphere, an oxygen gas atmosphere and the like. The baking time is preferably longer than a certain period so as to keep higher uniformity of thermal budget in the wafer surface, but also preferably not excessively long so as to prevent the diffusion of acid. In consideration of those, the baking time is preferably 20 to 500 seconds, more preferably 40 to 300 seconds.

(5) Development Step

After the exposing step, the film is optionally subjected to the post-exposure baking step and thereafter subjected to developing treatment. As a developer used in the development step, it is possible to adopt any developer employed for developing conventional photosensitive compositions. Although a TMAH solution is employed if it is necessary to determine the dissolution rate of polysiloxane in the present invention, that does not restrict the developer for forming a cured film. The developer is preferably an alkali developer, which is an aqueous solution of alkaline compound, such as, tetraalkylammonium hydroxide, choline, alkali metal hydroxide, alkali metal metasilicate (hydrate), alkali metal phosphate (hydrate), ammonia, alkylamine, alkanolamine, or heterocyclic amine. Particularly preferred alkali developers are aqueous solutions of TMAH, potassium hydroxide, and sodium hydroxide. Those alkali developers may further contain surfactants or water-soluble organic solvents, such as, methanol and ethanol, if necessary.

The developing method can be also freely selected from known methods, such as, dip, paddle, shower, slit, cap coat and spray development processes. As a result of the development, a pattern can be obtained. After developed with a developer, the pattern is preferably washed with water.

(6) Flood Exposure

If the photo acid- or base-generator is selected as the compound generating acid or base when exposed to heat or light, it is general to expose the whole film surface to light after the development. The step of flood exposure is carried out for the purpose of generating acid or base with the irradiated light. In addition, the flood exposure induces decomposition of the unreacted diazonaphthoquinone derivative left in the film, and thereby improves transparency of the film. Accordingly, if the film is required to be transparent, it is preferred to carry out the flood exposure step. In contrast, if the heat acid- or base-generator is selected, the flood exposure is not indispensable. However, it may be carried out with the aim of improving the transparency. In the flood exposure step, the whole surface of the film is, for example, exposed to light at about 100 to 2000 mJ/cm$^2$ (in terms of the reduced exposure amount at 365 nm) by means of an exposure system, such as, PLA-501 ([trademark], manufactured by Canon Inc.).

(7) Post-Baking Step

After the development step, the obtained pattern film is heated and thereby cured. The heating apparatus used in the post-baking step can be the same as that used in the post-exposure baking step. The heating temperature in this heating procedure is not particularly restricted as long as the film can be cured, and hence can be desirably determined. However, in consideration that the remaining silanol groups may prevent the cured film from having sufficient chemical resistance and also may increase the permittivity of the cured film, the heating temperature is generally selected to be relatively high. Specifically, the composition is preferably cured at a temperature of 360° C. or less. In order to leave the cured film in a high remaining film ratio, the heating temperature is more preferably 300° C. or less, further preferably 250° C. or less. On the other hand, in order to promote the curing reaction and to obtain a sufficiently cured film, the temperature is preferably 70° C. or more, further preferably 100° C. or more, particularly preferably 110° C. or more. The heating time is also not particularly restricted, but is generally 10 minutes to 24 hours, preferably 30 minutes to 3 hours. Here, the "heating time" means a period of time from when the temperature of the pattern film is elevated to reach the aimed heating temperature. It normally takes several minutes to several hours to heat the pattern film from the initial temperature up to the aimed heating temperature.

The cured film thus obtained can achieve excellent transparency, chemical resistance and environmental durability. For example, if cured at 230° C., the film can achieve optical transmittance of 95% or more and specific permittivity of 4 or less. Even if the film is thereafter placed under conditions of a temperature of 65° C. and a humidity of 90% for 1000 hours, the specific permittivity does not lower. Those characteristics of light transparency, specific permittivity, chemical resistance and environmental durability are not realized by conventional acrylic materials, and hence the cured film according to the present invention can be advantageously used in various applications. For example, as described above, it can be adopted as a planarization film of various devices such as flat panel display (FPD), as an interlayer insulating film for low temperature polysilicon, as a buffer coat film for IC chips, or as a transparent protective film.

The present invention will be further explained concretely by use of the following examples and comparative examples. However, those examples and comparative examples by no means restrict the present invention.

Measurements of gel permission chromatography (GPC) were carried out in two ways by use of HLC-8220GPC type high-speed GPC system ([trademark], manufactured by TOSOH CORPORATION) and Super Multipore HZ-N type GPC column ([trademark], manufactured by TOSOH CORPORATION) under the conditions of:

standard sample: monodispersed polystyrene,
developing solvent: tetrahydrofuran,
flow: 0.6 ml/minute, and
column temperature: 40° C.

Synthesis Example 1 (Synthesis of Polysiloxane A)

In a 2-L flask equipped with a stirrer, a thermometer and a condenser, 32.5 g of a 25 wt % TMAH aqueous solution, 800 ml of isopropyl alcohol (IPA) and 2.0 g of water were placed. Independently, 39.7 g of phenyltrimethoxysilane, 34.1 g of methyltrimethoxysilane and 7.6 g of tetramethoxysilane were mixed to prepare a mixed solution, which was then placed in a dropping funnel. The mixed solution was then dropped into the reaction vessel at 10° C., and successively the obtained mixture was stirred at the same temperature for 3 hours. Subsequently, 10% HCl aqueous solution was added to neutralize the mixture, and then 400 ml of toluene and 100 ml of water were added into the neutralized mixture, so that the mixture was separated into two layers. The organic layer was collected and condensed under reduced pressure to remove the solvent. To the obtained concentrate, PGMEA was added so that the solid content might be 40 wt %.

The molecular weight (in terms of polystyrene reduced value) of the obtained polysiloxane was measured by GPC to find the weight average molecular weight (hereinafter, often referred to as "Mw")=1800. Further, the obtained resin solution was coated on a silicon wafer so that the formed film might have a thickness of 2 μm after prebaked by means of a spin-coater (MS-A100 [trademark], manufactured by MIKASA Co., Ltd.), and then prebaked. Thereafter, the alkali dissolution rate (hereinafter, often referred to as "ADR") in a 2.38% TMAH aqueous solution was measured and found to be 1200 Å/second. The crosslinking density index was also measured and found to be 3.1.

Synthesis Example 2 (Synthesis of Polysiloxane B)

The procedure of Synthesis example 1 was repeated except that the amounts of the TMAH aqueous solution and methyltrimethoxysilane were changed into 24.5 g and 40.8 g, respectively, and also except that 7.6 g of tetramethoxysilane was omitted. The obtained polysiloxane was measured to find Mw=1350, ADR=1500 Å/second and crosslinking density index: 3.0.

Synthesis Example 3 (Synthesis of Polysiloxane C)

In a 2-L flask equipped with a stirrer, a thermometer and a condenser, 2 g of a 35 wt % hydrochloric acid (HCl) aqueous solution, 400 ml of PGMEA and 10.0 g of water were placed. Independently, 39.7 g of phenyltrimethoxysilane, 34.1 g of methyltrimethoxysilane, 30.8 g of tris-(3-trimethoxysilylpropyl)isocyanurate and 0.3 g of trimethoxysilane were mixed to prepare a mixed solution, which was then placed in a dropping funnel. The mixed solution was dropped into the reaction vessel at 10° C., and successively the obtained mixture was stirred at the same temperature for 3 hours. Subsequently, 200 ml of toluene and 200 ml of water were added into the mixture, so that the mixture was separated into two layers. The organic layer was collected and condensed under reduced pressure to remove the solvent. To the obtained concentrate, PGMEA was added so that the solid content might be 40 wt %.

The thus obtained polysiloxane was measured to find Mw=7500, ADR=6400 Å/second and crosslinking density index: 3.6.

Synthesis Example 4 (Synthesis of Alkali-Soluble Resins A to E)

In a flask equipped with a stirrer, a thermometer, a condenser and a nitrogen gas-inlet tube, each solvent shown in Table 2 was placed. Under an atmosphere of nitrogen gas, the solvent was then heated to a temperature properly determined by reference to the 10-hour half-life temperature of each initiator. Independently, each monomer shown in Table 1 and each initiator shown in Table 2 were mixed to prepare a mixture, which was then dropped into the solvent over 4 hours. Subsequently, the reaction was let to proceed for 3 hours, to individually produce solutions of alkali-soluble resins A to E. The blend amounts in Tables are shown in terms of weight parts.

TABLE 1

| alkali-soluble resin | monomer | | | | | | | | | |
|---|---|---|---|---|---|---|---|---|---|---|
| | carboxyl-containing monomer | | alkoxysilyl-containing monomer | | hydroxyl-containing monomer | | other monomers | | | |
| | AA | MAA | KBM503 | KBM502 | HEMA | HEA | MMA | BA | Sty | CHA |
| A | 0 | 10 | 10 | 10 | 20 | 0 | 25 | 25 | 0 | 0 |
| B | 0 | 10 | 0 | 40 | 20 | 0 | 25 | 0 | 5 | 0 |
| C | 5 | 5 | 0 | 0 | 10 | 10 | 50 | 0 | 0 | 20 |
| D | 5 | 0 | 10 | 10 | 20 | 0 | 30 | 25 | 0 | 0 |
| E | 0 | 15 | 0 | 20 | 20 | 0 | 20 | 25 | 0 | 0 |

Remarks)
AA: acrylic acid,
MAA: methacrylic acid,
KBM-503 ([trademark], manufactured by Shin-Etsu Chemical Co., Ltd.): γ-methacryloxypropyltrimethoxysilane,
KBM-502 ([trademark], manufactured by Shin-Etsu Chemical Co., Ltd.): γ-methacryloxypropylmethyldimethoxysilane,
HEMA: 2-hydroxyethyl methacrylate,
HEA: 2-hydroxyethyl acrylate,
MMA: methyl methacrylate,
BA: butyl acrylate,
Sty: styrene,
CHA: cyclohexyl acrylate

TABLE 2

| alkali-soluble resin | initiator | | solvent | | | |
|---|---|---|---|---|---|---|
| | AIBN | V-65 | C4 alcohol butanol | C5 alcohol pentanol | acetate PGMEA | ester ethyl lactate |
| A | 0 | 10 | 100 | 0 | 0 | 50 |
| B | 10 | 0 | 100 | 50 | 0 | 0 |
| C | 10 | 0 | 100 | 0 | 50 | 0 |
| D | 0 | 10 | 100 | 0 | 50 | 0 |
| E | 10 | 0 | 100 | 0 | 50 | 0 |

Remarks)
AIBN: azobisisobutyronitrile,
V-65 ([trademark], manufactured by Wako Pure Chemical Industries, Ltd.): 2,2'-azobis (2,4-dimethylvaleronitrile),
PGMEA: propylene glycol monomethyl ether acetate Table 3 shows the weight average molecular weight Mw and solid content acid value of each obtained alkali-soluble resin.

TABLE 3

| alkali-soluble resin | properties | |
|---|---|---|
| | Mw | solid content acid value NV100% |
| A | 8500 | 65 |
| B | 29000 | 65 |
| C | 5400 | 71 |
| D | 7500 | 39 |
| E | 9000 | 98 |

Example 1

A solution of the alkali-soluble resin A obtained in Synthesis example 4 and a solution of the polysiloxane A obtained in Synthesis example 1 were mixed in a weight ratio of 1:9 in terms of solid content of the resins, to obtain a polymer mixture. To the polymer mixture, 4-4'-(1-(4-(1-(4-hydroxyphenol)-1-methylethyl)phenyl) ethylidene)bisphenol derivative with 2.0 mol of diazonaphthoquinone, as the diazonaphthoquinone derivative, in an amount of 10 weight parts; and 1,8-naphthalimidyl triflate (NAI-105 [trademark], manufactured by Midori Kagaku Co., Ltd.), as the photo acid-generator A, in an amount of 5 weight parts were added. This photo acid-generator has no absorption peaks in the wavelength range of 400 to 800 nm. In addition to the above, a surfactant (KF-53 [trademark], manufactured by Shin-Etsu Chemical Co., Ltd.) in an amount of 0.1 weight part was incorporated, and then PGMEA was added so that the concentration might be 35%, to obtain a composition. Here, the blend ratio (in terms of weight part) of each ingredient is based on the assumption that the total weight of the polysiloxanes and the alkali-soluble resin is regarded as 100 weight parts.

The composition was then spin-coated on a silicon wafer, and then prebaked on a hot-plate at 100° C. for 90 seconds so as to form a film of 2 μm thickness. The film was confirmed to have no tucks and not to be adhesive, and thereafter subjected to exposure at 200 mJ/cm$^2$ by means of g- and h-lines exposure system FX-604 (NA=0.1) ([trademark], manufactured by Nikon Corporation). Subsequently, the film was immersed for 60 seconds in a 2.38% TMAH aqueous solution, and rinsed with pure water for 30 seconds. After that, the whole surface of the film was exposed to light at 600 mJ/cm$^2$ by means of g-, h- and i-lines exposure system PLA-501F ([trademark], manufactured by Canon Inc.). Finally, the film was subjected to post-baking at 230° C. for 1 hour. As the result, it was confirmed that 3-μm line-and-space (L/S) and contact-hole (C/H) patterns were formed.

The obtained cured film was partially scraped off to obtain 10 mg of the shaves, which were then heated from 30° C. up to 250° C. at an elevation rate of 20° C./minute under an air atmosphere so as to measure reduction of the weight by means of Thermo plus EVO2/TG-DTA ([trademark], manufactured by Rigaku Corporation). As the result, the weight reduction was found to be 0.8%.

Examples 2 to 13, Comparative Examples 1 and 2

The procedure of Example 1 was repeated except for changing the ingredients into those shown in Table 4, to prepare and evaluate the compositions. The results are shown in Table 4.

TABLE 4

| | | Examples | | | | | | | |
|---|---|---|---|---|---|---|---|---|---|
| | | 1 | 2 | 3 | 4 | 5 | 6 | 7 | 8 |
| ingredients | alkali-soluble resin A | 10 | 20 | 50 | 80 | 80 | 20 | 20 | 0 |
| | alkali-soluble resin B | 0 | 0 | 0 | 0 | 0 | 0 | 0 | 20 |
| | alkali-soluble resin C | 0 | 0 | 0 | 0 | 0 | 0 | 0 | 0 |
| | alkali-soluble resin D | 0 | 0 | 0 | 0 | 0 | 0 | 0 | 0 |
| | alkali-soluble resin E | 0 | 0 | 0 | 0 | 0 | 0 | 0 | 0 |
| | polysiloxane A | 90 | 80 | 50 | 20 | 10 | 80 | 80 | 80 |
| | polysiloxane B | 0 | 0 | 0 | 0 | 10 | 0 | 0 | 0 |
| | polysiloxane C | 0 | 0 | 0 | 0 | 0 | 0 | 0 | 0 |
| | diazonaphtho-quinone derivative | 10 | 10 | 10 | 10 | 10 | 10 | 10 | 10 |
| | photo acid-generator A | 5 | 5 | 5 | 5 | 5 | 0 | 0 | 5 |
| | photo acid-generator B | 0 | 0 | 0 | 0 | 0 | 5 | 0 | 0 |
| | photo acid-generator C | 0 | 0 | 0 | 0 | 0 | 0 | 5 | 0 |
| | heat base-generator | 0 | 0 | 0 | 0 | 0 | 0 | 0 | 0 |
| | photo base-generator | 0 | 0 | 0 | 0 | 0 | 0 | 0 | 0 |
| results | weight reduction | 0.70% | 0.80% | 2.10% | 3.00% | 3.40% | 0.70% | 0.80% | 0.50% |
| | resolution | A | A | A | B | B | A | B | A |
| | chemical resistance | A | A | A | A | A | A | A | A |

TABLE 4-continued

|  |  | Examples | | | | | Com. Ex. | |
| --- | --- | --- | --- | --- | --- | --- | --- | --- |
|  |  | 9 | 10 | 11 | 12 | 13 | 1 | 2 |
| ingredients | alkali-soluble resin A | 0 | 0 | 20 | 20 | 20 | 0 | 80 |
|  | alkali-soluble resin B | 0 | 0 | 0 | 0 | 0 | 0 | 0 |
|  | alkali-soluble resin C | 0 | 0 | 0 | 0 | 0 | 80 | 0 |
|  | alkali-soluble resin D | 20 | 0 | 0 | 0 | 0 | 0 | 0 |
|  | alkali-soluble resin E | 0 | 20 | 0 | 0 | 0 | 0 | 0 |
|  | polysiloxane A | 80 | 80 | 80 | 80 | 0 | 20 | 20 |
|  | polysiloxane B | 0 | 0 | 0 | 0 | 60 | 0 | 0 |
|  | polysiloxane C | 0 | 0 | 0 | 0 | 20 | 0 | 0 |
|  | diazonaphtho-quinone derivative | 10 | 10 | 10 | 10 | 10 | 10 | 10 |
|  | photo acid-generator A | 5 | 5 | 0 | 0 | 5 | 5 | 0 |
|  | photo acid-generator B | 0 | 0 | 0 | 0 | 0 | 0 | 0 |
|  | photo acid-generator C | 0 | 0 | 0 | 0 | 0 | 0 | 0 |
|  | heat base-generator | 0 | 0 | 1 | 0 | 0 | 0 | 0 |
|  | photo base-generator | 0 | 0 | 0 | 1 | 0 | 0 | 0 |
| results | weight reduction | 0.90% | 0.80% | 0.70% | 0.70% | 0.80% | 7.00% | 3.50% |
|  | resolution | A | A | A | A | A | D | D |
|  | chemical resistance | A | A | A | A | A | B | A |

Remarks)
photo acid-generator B: 5-norbornene-2,3-dicarboxyimidyl triflate (NDI105 [trademark], manufactured by Midori Kagaku Co., Ltd.),
photo acid-generator C: "TME-triazine" ([trademark], manufactured by Sanwa Chemical Co., Ltd.), which has an absorbance ratio of 1 or less at 365 nm/405 nm.
heat base-generator: 1,8-diazabicyclo(5.4.0)undecene-7-orthophthalic acid salt
photo base-generator: 3-(2-hydroxy-4-methoxyphenyl)-1-(1-(4-hydroxymethylpiperidine))-2-propene-1-one, which has no absorption peaks in the wavelength range of 400 to 800 nm.

The properties were evaluated in the following manners.
Resolution After the post-baking treatment, each pattern was observed with an optical microscope and thereby graded according the following criteria:
A: capable of forming line-and-spaces of less than 3 μm,
B: capable of forming line-and-spaces of 3 μm or more but less than 5 μm,
C: capable of forming line-and-spaces of 5 μm or more but less than 10 μm, and
D: incapable of forming line-and-spaces of 10 μm or more.
Chemical Resistance After the post-baking treatment, each pattern was immersed in a stripping solution (TOK-106 [trademark], manufactured by TOKYO OHKA KOGYO Co., Ltd.) at 40° C. for 2 minutes. Thereafter, the section of the pattern was observed with a scanning electron microscope (JSM-7100F [trademark], manufactured by JEOL Ltd.).
A: No peeling was found at the interface between the substrate and the contact-hole pattern of 20 μm.
B: Peeling was found at the interface between the substrate and the contact-hole pattern of 20 μm.

The invention claimed is:
1. A composition comprising:
an alkali-soluble resin which is a polymer comprising a carboxyl-containing polymerization unit and an alkoxysilyl-containing polymerization unit,
a polysiloxane,
a diazonaphthoquinone derivative,
a compound generating acid or base when exposed to heat or light, and
a solvent and
wherein said compound generating acid or base when exposed to heat or light is a photo acid- or base-generator whose absorbance ratio at 365 nm/436 nm or at 365 nm/405 nm is 5/1 or more.
2. The composition according to claim 1, wherein said carboxyl-containing polymerization unit is derived from an unsaturated carboxylic acid, an unsaturated carboxylic anhydride, or a mixture thereof.
3. The composition according to claim 1, wherein said alkoxysilyl-containing polymerization unit is derived from a monomer represented by the following formula (I):

$$X-(CH_2)_a-Si(OR)_b(CH_3)_{3-b} \quad (I)$$

in which
X is a vinyl, styryl or (meth)acryloyloxy group;
R is methyl or ethyl group;
a is an integer of 0 to 3; and
b is an integer of 1 to 3.
4. The composition according to claim 1, wherein said polysiloxane is derived from a monomer represented by the following formula (II):

$$R^1[Si(OR^2)_3]_p \quad (II)$$

in which
p is an integer of 1 to 3;
R$^1$ is hydrogen or a p-valent straight, branched or cyclic hydrocarbon group which has 20 or less carbon atoms and which may contain oxygen or nitrogen, provided that any hydrogen of the hydrocarbon group may be replaced with fluorine; and
each R$^2$ is independently hydrogen or an alkyl group having 1 to 10 carbon atoms.
5. The composition according to claim 1, wherein said compound generating acid or base when exposed to heat or light is a photo acid- or base-generator whose absorbance ratio at 365 nm/436 nm or at 365 nm/405 nm is 10/1 or more.

6. The composition according to claim 1, wherein said alkali-soluble resin has a weight average molecular weight of 3000 to 50000.

7. The composition according to claim 1, wherein said polysiloxane has a weight average molecular weight of 800 to 15000.

8. The composition according to claim 1, wherein the mixing ratio of said alkali-soluble resin and said polysiloxane is 5:95 to 95:5 by weight.

9. A method for forming a cured film, comprising:

coating a substrate with the composition according to claim 1, to form a coating film;

exposing the coating film to light;

developing the exposed film with an alkali developer, to form a pattern; and heating the obtained pattern.

10. The method for forming a cured film, according to claim 9; which further comprises the step of exposing the whole film surface to light before the step of heating the obtained pattern.

11. A cured film produced by a method comprising:

coating a substrate with the composition according to claim 1, to form a coating film;

exposing the coating film to light;

developing the exposed film with an alkali developer, to form a pattern; and heating the obtained pattern.

12. A device comprising the cured film according to claim 11.

13. The composition according to claim 2, wherein said alkoxysilyl-containing polymerization unit is derived from a monomer represented by the following formula (I):

(I)

in which

X is a vinyl, styryl or (meth)acryloyloxy group;

R is methyl or ethyl group;

a is an integer of 0 to 3;

b is an integer of 1 to 3.

14. The composition according to claim 2, wherein said alkoxysilyl-containing polymerization unit is derived from a monomer represented by the following formula (I):

(I)

in which

X is a vinyl, styryl or (meth)acryloyloxy group;

R is methyl or ethyl group;

a is an integer of 0 to 3;

b is an integer of 1 to 3 and said polysiloxane is derived from a monomer represented by the following formula (II):

(II)

in which p is an integer of 1 to 3;

$R^1$ is hydrogen or a p-valent straight, branched or cyclic hydrocarbon group which has 20 or less carbon atoms and which may contain oxygen or nitrogen, provided that any hydrogen of the hydrocarbon group may be replaced with fluorine; and each $R^2$ is independently hydrogen or an alkyl group having 1 to 10 carbon atoms.

15. The composition according to claim 14, wherein said compound generating acid or base when exposed to light is a photo acid- or base-generator whose absorbance ratio at 365 nm/436 nm or at 365 nm/405 nm is 10/1 or more.

16. The composition according to claim 14, wherein said compound generating acid or base when exposed to light is a photo acid-generator whose absorbance ratio at 365 nm/436 nm or at 365 nm/405 nm is 5/1 or more.

17. The composition according to claim 14, wherein said compound generating acid or base when exposed to light is a photo base-generator whose absorbance ratio at 365 nm/436 nm or at 365 nm/405 nm is 5/1 or more.

18. The composition according to claim 14, wherein said alkali-soluble resin has a weight average molecular weight of 3000 to 50000, said polysiloxane has a weight average molecular weight of 800 to 15000 and the mixing ratio of said alkali-soluble resin and said polysiloxane is 5:95 to 95:5 by weight.

19. The composition according to claim 1, wherein said compound generating acid or base when exposed to heat or light is a photo acid- or base-generator whose absorbance ratio at 365 nm/436 nm or at 365 nm/405 nm is 100/1 or more.

20. The composition according to claim 19, wherein said compound generating acid or base is exposed to light.

* * * * *